United States Patent
Huang et al.

(10) Patent No.: US 11,631,604 B2
(45) Date of Patent: Apr. 18, 2023

(54) LOAD PORT DEVICE, GAS GATE AND GAS-PROVIDING METHOD

(71) Applicant: NANYA TECHNOLOGY CORPORATION, New Taipei (TW)

(72) Inventors: Jih-Cheng Huang, Taoyuan (TW); Sun-Fu Chou, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/932,444

(22) Filed: Jul. 17, 2020

(65) Prior Publication Data
US 2022/0020620 A1     Jan. 20, 2022

(51) Int. Cl.
*H01L 21/673* (2006.01)
*H01L 21/67* (2006.01)

(52) U.S. Cl.
CPC .. *H01L 21/67393* (2013.01); *H01L 21/67253* (2013.01); *H01L 21/67389* (2013.01)

(58) Field of Classification Search
CPC ............... H01L 21/67393; H01L 21/67253
USPC .......................................................... 137/2
See application file for complete search history.

(56) References Cited

U.S. PATENT DOCUMENTS

| | | | | |
|---|---|---|---|---|
| 5,988,233 A * | 11/1999 | Fosnight | ........... | H01L 21/67376 414/217 |
| 6,573,031 B2 * | 6/2003 | Shinya | ........... | H01L 21/67253 430/327 |
| 10,325,794 B2 * | 6/2019 | Murata | ........... | H01L 21/67769 |
| 10,424,520 B1 * | 9/2019 | Sasaki | ........... | H01L 21/6719 |
| 2009/0192652 A1 * | 7/2009 | Yamada | ........... | H01L 21/67109 700/282 |
| 2010/0154711 A1 * | 6/2010 | Ishibashi | ........... | C23C 16/45502 118/725 |
| 2013/0213442 A1 * | 8/2013 | Kaise | ........... | H01L 21/67393 134/22.18 |

(Continued)

FOREIGN PATENT DOCUMENTS

| CN | 0101674049 A | 3/2010 |
|---|---|---|
| CN | 101764049 A | 6/2010 |

(Continued)

OTHER PUBLICATIONS

"Mechanical Drawing Symbols", ConceptDraw, Jul. 18, 2018 [Retrieved from Internet URL: https://web.archive.org/web/20180709194730/ https://www.conceptdraw.com/examples/valve-symbols] (Year: 2018).*

(Continued)

*Primary Examiner* — Timothy P. Kelly
*Assistant Examiner* — Stephanie A Shrieves
(74) *Attorney, Agent, or Firm* — Muncy, Geissler, Olds & Lowe, P.C.

(57) ABSTRACT

The present disclosure provides a load port device, a gas gate and a gas-providing method. The load port device includes a gas-providing nozzle and the gas gate. The gas-providing nozzle is used for providing gas to a wafer container. The gas gate includes a plurality of gas inlet ports, a gas-providing port and a controller. Each gas inlet port connects to a gas source. The gas-providing port connects to the gas-providing nozzle. The controller is configured to: select one of the plurality of gas inlet ports; and connect the selected gas inlet port to the gas-providing port.

14 Claims, 20 Drawing Sheets

(56) References Cited

U.S. PATENT DOCUMENTS

| | | | | |
|---|---|---|---|---|
| 2017/0069516 A1* | 3/2017 | Chen | ............ | H01L 21/67389 |
| 2018/0082875 A1* | 3/2018 | Sasaki | ............ | H01L 21/67769 |
| 2018/0247846 A1* | 8/2018 | Murata | ............ | H01L 21/67389 |
| 2018/0269095 A1* | 9/2018 | Reuter | ............ | H01L 21/67775 |
| 2018/0286726 A1* | 10/2018 | Rebstock | ............ | G03F 7/70741 |
| 2019/0035660 A1* | 1/2019 | Lin | ............ | H01L 21/67393 |
| 2020/0176293 A1* | 6/2020 | Lee | ............ | H01L 21/67017 |
| 2020/0234988 A1* | 7/2020 | Lin | ............ | H01L 21/67772 |

FOREIGN PATENT DOCUMENTS

| | | | | |
|---|---|---|---|---|
| CN | 109290321 A | | 2/2019 | |
| JP | 2012248887 A | * | 12/2012 | ....... H01L 21/67389 |
| TW | I-617368 B | | 3/2018 | |

OTHER PUBLICATIONS

JP-2012248887-A English Translation of Specification (Year: 2021).*

\* cited by examiner

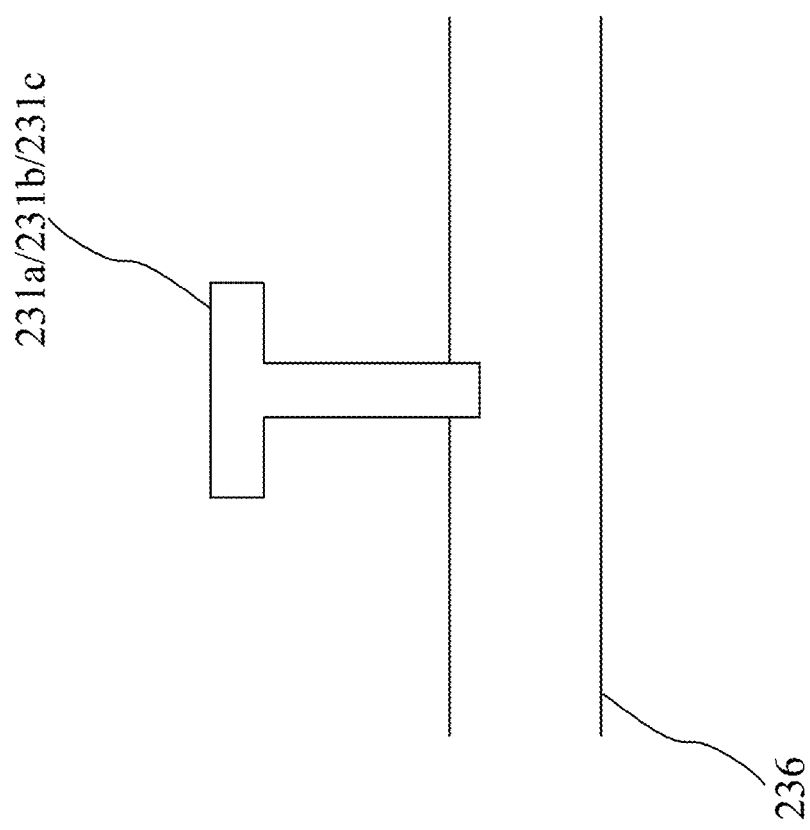

LOAD PORT DEVICE, GAS GATE AND GAS-PROVIDING METHOD

TECHNICAL FIELD

The present disclosure relates to a load port device, a gas gate and a gas-providing method, and more particularly, to a load port device, a gas gate and a gas-providing method for purging a wafer container.

DISCUSSION OF THE BACKGROUND

In the semiconductor industry, a wafer container is used for loading wafers. During the processing of the wafers, airborne molecular contamination (AMC) can enter the wafer container and damage the wafers in the wafer container. Various techniques that use gas to purge AMC from the wafer container have been introduced. However, different purging processes with different gases must be completed on different devices, which is very inefficient and high in cost.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a load port device, including a gas-providing nozzle and a gas gate. The gas-providing nozzle is used for providing gas to a wafer container. The gas gate includes: a plurality of gas inlet ports, a gas-providing port and a controller. Each gas inlet port connects to a gas source. The gas-providing port connects to the gas-providing nozzle. The controller is configured to: select one of the plurality of gas inlet ports; and connect the selected gas inlet port to the gas-providing port.

In some embodiments, the load port device further includes a pipe for connecting the gas-providing port to the gas-providing nozzle.

In some embodiments, the gas gate further includes a pipe for connecting the plurality of gas inlet ports to the gas-providing port.

In some embodiments, each gas inlet port has an electric valve electrically coupled to the controller. The controller is further configured to open the electric valve of the selected gas inlet port for connecting the selected gas inlet port to the gas-providing port.

In some embodiments, the controller is further configured to close the electric valve of each gas inlet port except for the electric valve of the selected gas inlet port.

In some embodiments, the controller is further configured to determine a flow rate parameter for the selected gas inlet port according to a gas control configuration. The electric valve of the selected gas inlet port is opened according to the flow rate parameter.

In some embodiments, the electric valve of the selected gas inlet port is opened for a duration according to a gas control configuration.

In some embodiments, the load port device further includes a sensor electrically coupled to the controller. The sensor is configured to sense a humidity or a concentration of oxygen in the wafer container. The controller is further configured to determine whether the humidity or the concentration of oxygen is greater than a threshold. The selected gas inlet port is selected according to a gas control configuration when the humidity or the concentration of oxygen is greater than the threshold.

Another aspect of the present disclosure provides a gas gate for use in a load port device. The gas gate includes: a plurality of gas inlet ports, a gas-providing port and a controller. Each gas inlet port connects to a gas source. The gas-providing port connects to a gas-providing nozzle of the load port device. The controller is configured to: select one of the plurality of gas inlet ports; and connect the selected gas inlet port to the gas-providing port.

In some embodiments, the gas gate further includes a pipe for connecting the plurality of gas inlet ports to the gas-providing port.

In some embodiments, each gas inlet port has an electric valve electrically coupled to the controller. The controller is further configured to open the electric valve of the selected gas inlet port for connecting the selected gas inlet port to the gas-providing port.

In some embodiments, the controller is further configured to close the electric valve of each gas inlet port except for the electric valve of the selected gas inlet port.

In some embodiments, the controller is further configured to determine a flow rate parameter for the selected gas inlet port according to a gas control configuration. The electric valve of the selected gas inlet port is opened according to the flow rate parameter.

In some embodiments, the electric valve of the selected gas inlet port is opened for a duration according to a gas control configuration.

In some embodiments, the controller is further configured to determine whether a humidity or a concentration of oxygen in the wafer container is greater than a threshold. The humidity or the concentration of oxygen is sensed by a sensor of the load port device. The selected gas inlet port is selected according to a gas control configuration when the humidity or the concentration of oxygen is greater than the threshold.

Another aspect of the present disclosure provides a gas-providing method for a gas gate of a load port device. The gas-providing method includes: selecting, by a controller, one of a plurality of gas inlet ports of the gas gate, wherein each gas inlet port connects to a gas source; and connecting the selected gas inlet port to a gas-providing port of the gas gate, wherein the gas-providing port connects to a gas-providing nozzle of the load port device.

In some embodiments, the gas-providing method further includes: opening, by the controller, an electric valve of the selected gas inlet port for connecting the selected gas inlet port to the gas-providing port.

In some embodiments, the gas-providing method further includes: closing, by the controller, an electric valve of each gas inlet port except for the electric valve of the selected gas inlet port.

In some embodiments, the gas-providing method further includes: determining a flow rate parameter for the selected gas inlet port according to a gas control configuration; wherein the electric valve of the selected gas inlet port is opened according to the flow rate parameter.

In some embodiments, the gas-providing method further includes: determining, by the controller, whether a humidity or a concentration of oxygen in a wafer container is greater than a threshold, wherein the humidity or the concentration of oxygen is sensed by a sensor of the load port device; wherein the selected gas inlet port is selected according to a gas control configuration when the humidity or the concentration of oxygen is greater than the threshold.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIGS. 2F to 2G are schematic views of electric valves in operation according to some embodiments of the present disclosure.

DETAILED DESCRIPTION

Figure 1:
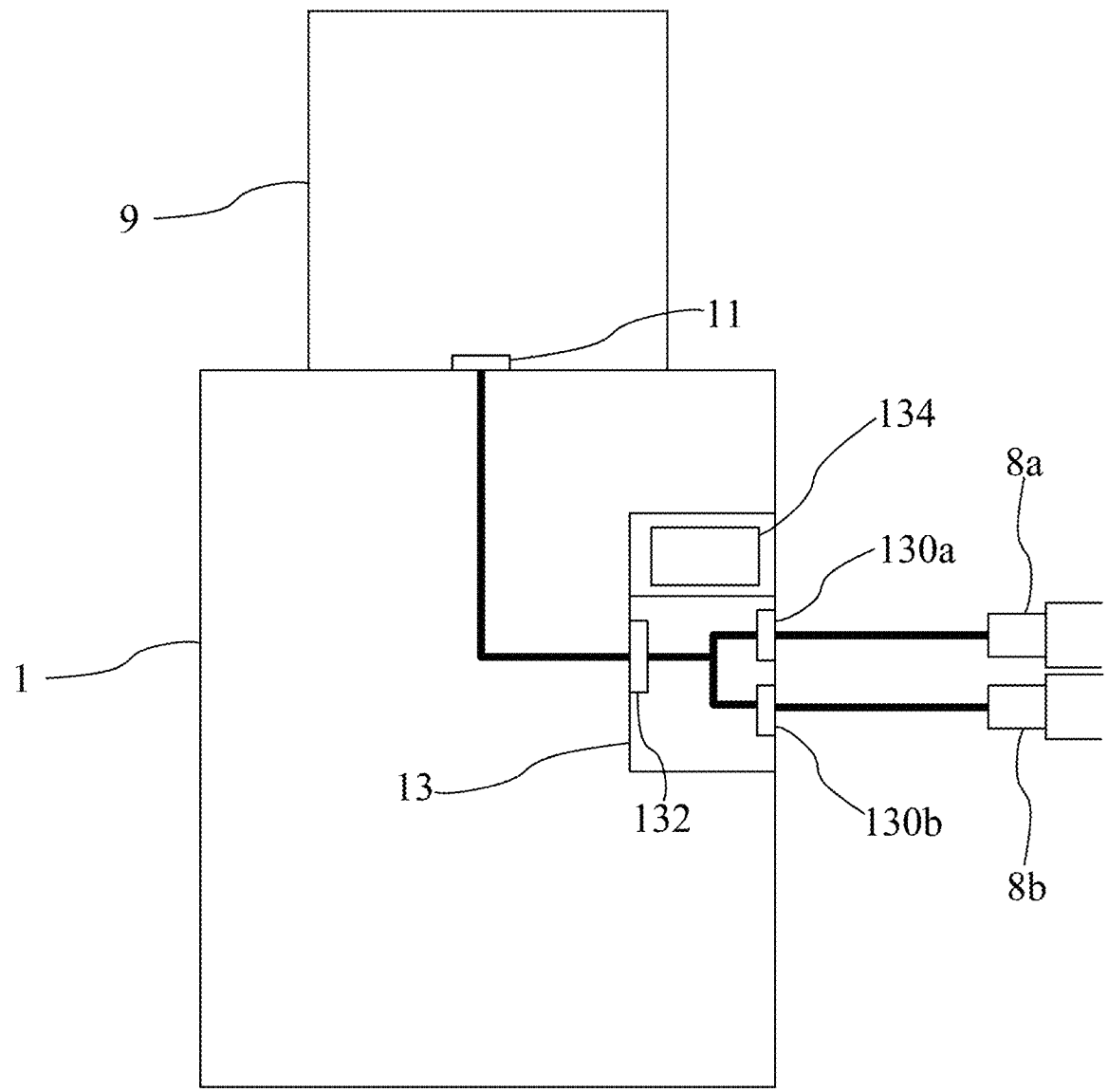
FIG. 1 is a schematic view of a load port device according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a load port device 1 according to some embodiments of the present disclosure. The load port device 1 may be used for purging a wafer container 9 (e.g., a front-opening unified pod, FOUP) with gases. The load port device 1 may include a gas-providing nozzle 11 and a gas gate 13.

In detail, when the load port device 1 is loaded with the wafer container 9, the gas-providing nozzle 11 may be engaged with a gas inlet of the wafer container 9 for providing gas to the wafer container 9. The gas gate 13 may be used for connecting one gas source to the gas-providing nozzle 11.

Particularly, the gas gate 13 may include a plurality of gas inlet ports 130a and 130b, a gas-providing port 132 and a controller 134. The gas-providing port 132 of the gas gate 13 may connect to the gas-providing nozzle 11 of the load port device 1. The gas inlet ports 130a and 130b of the gas gate 13 may connect to gas sources 8a and 8b respectively. The gas inlet port 130a connected to the gas source 8a may receive gas from the gas source 8a. The gas inlet port 130b connected to the gas source 8b may receive gas from the gas source 8b.

In some embodiments, the controller 134 of the gas gate 13 may select one gas inlet port of the gas inlet ports 130a and 130b, and then connect the selected gas inlet port to the gas-providing port 132. When the selected gas inlet port is connected to the gas-providing port 132, the gas supplied by the corresponding gas source to the selected gas inlet port may be provided to the gas-providing nozzle 11. Subsequently, the wafer container 9 may be purged with the gas from the gas source corresponding to the selected gas inlet port.

For example, the controller 134 of the gas gate 13 selects the gas inlet port 130a, and connects the gas inlet port 130a to the gas-providing port 132. Therefore, when the gas inlet port 130a is connected to the gas-providing port 132, the gas supplied by the corresponding gas source 8a to the gas inlet port 130a may be provided to the gas-providing nozzle 11. Subsequently, the wafer container 9 may be purged with the gas from the gas source 8a.

Similarly, in another example, the controller 134 of the gas gate 13 selects the gas inlet port 130b, and connects the gas inlet port 130b to the gas-providing port 132. Therefore, when the gas inlet port 130b is connected to the gas-providing port 132, the gas supplied by the corresponding gas source 8b to the gas inlet port 130b may be provided to the gas-providing nozzle 11. Subsequently, the wafer container 9 may be purged with the gas from the gas source 8b.

Figure 2A:
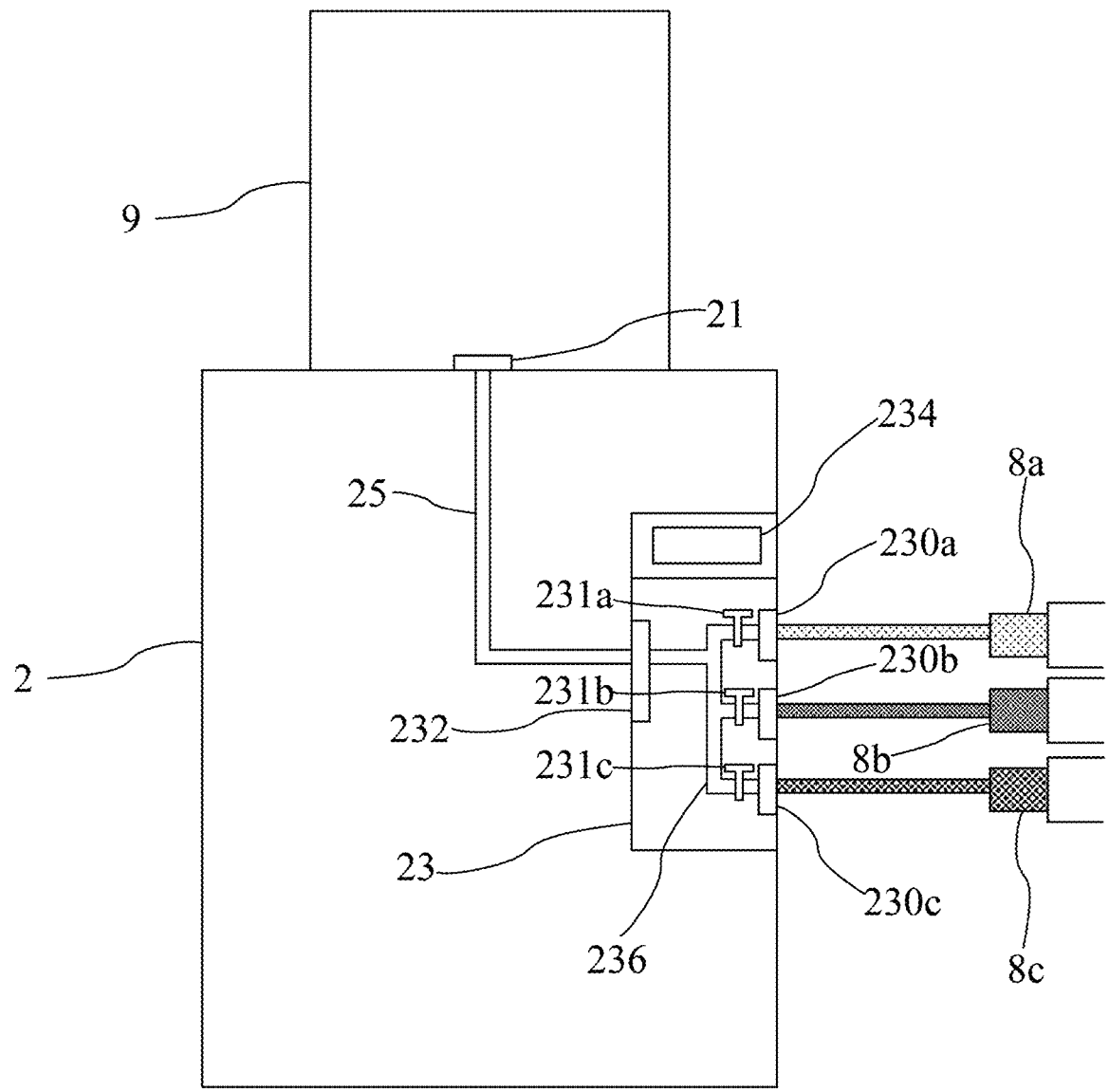
FIG. 2A is a schematic view of a load port device according to some embodiments of the present disclosure.

FIG. 2A is a schematic view of a load port device 2 according to some embodiments of the present disclosure. The load port device 2 may be used for purging the wafer container 9 with gases. The load port device 2 may include a gas-providing nozzle 21, a gas gate 23 and a pipe 25.

In detail, when the load port 2 is loaded with the wafer container 9, the gas-providing nozzle 21 may be engaged with the gas inlet of the wafer container 9 for providing gas to the wafer container 9. The gas gate 23 may be used for connecting one gas source to the gas-providing nozzle 21.

Particularly, the gas gate 23 may include a plurality of gas inlet ports 230a to 230c, a gas-providing port 232, a controller 234 and a pipe 236. The gas-providing port 232 of the gas gate 23 may connect to the gas-providing nozzle 21 of the load port device 2 via the pipe 25. The gas inlet ports 230a to 230c may connect to the gas-providing port 232 via the pipe 236.

Further, the gas inlet ports 230a to 230c of the gas gate 23 may connect to gas sources 8a to 8c, respectively. The gas inlet port 230a connected to the gas source 8a may receive gas from the gas source 8a. The gas inlet port 230b connected to the gas source 8b may receive gas from the gas source 8b. The gas inlet port 230c connected to the gas source 8c may receive gas from the gas source 8c.

Figure 2B:
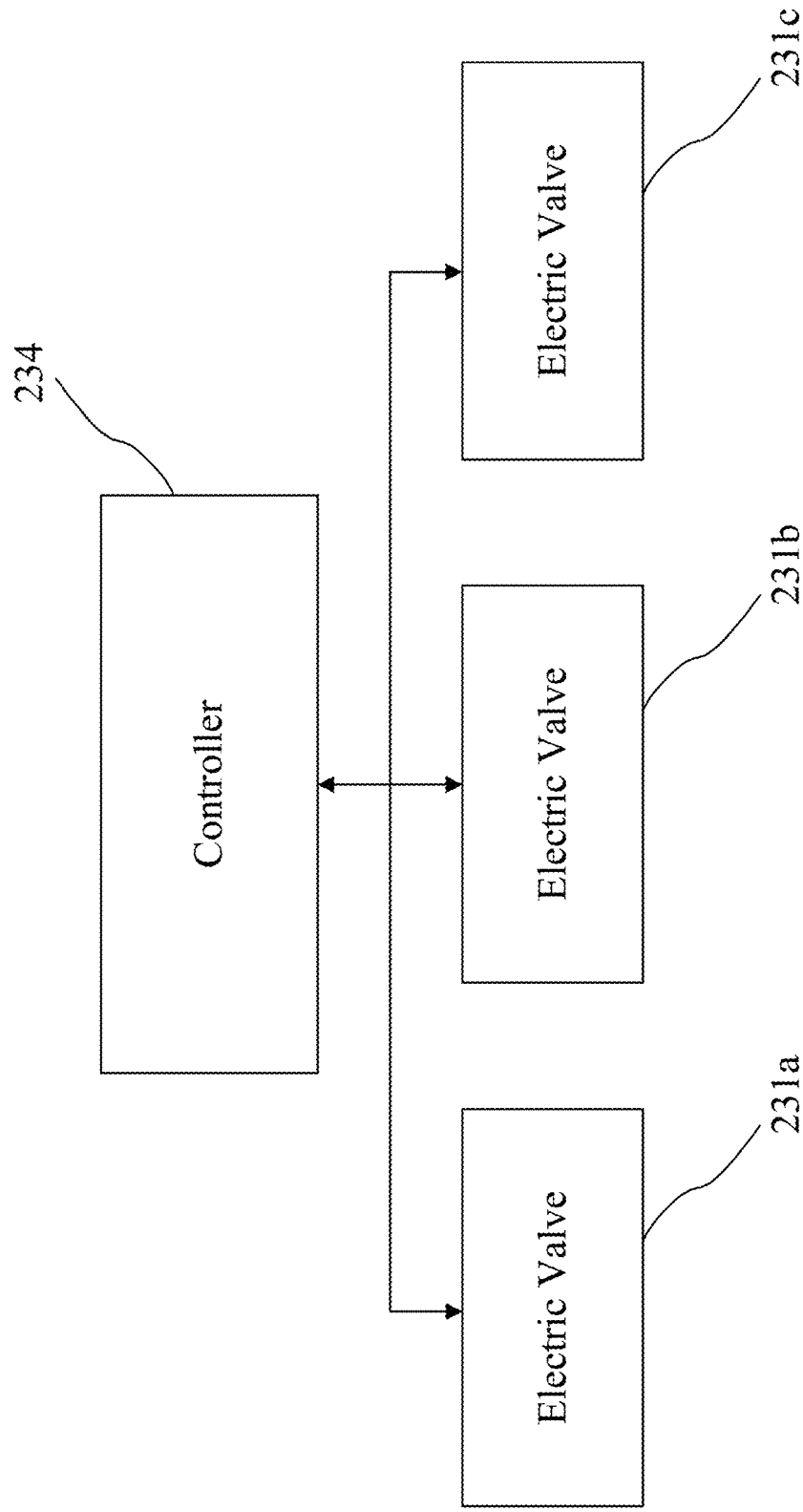
FIG. 2B is a block diagram of electric components according to some embodiments of the present disclosure.

In some embodiments, each gas inlet port may have an electric valve. In detail, the gas inlet port 230a may have an electric valve 231a, the gas inlet port 230b may have an electric valve 231b, and the gas inlet port 230c may have an electric valve 231c. FIG. 2B is a block diagram of electric components according to some embodiments of the present disclosure. The electric valves 231a to 231c may be electrically coupled to the controller 234 and controlled by the controller 234.

In some embodiments, the controller 234 of the gas gate 23 may select one gas inlet port of the gas inlet ports 230a to 230c, and then connect the selected gas inlet port to the gas-providing port 232. When the selected gas inlet port is connected to the gas-providing port 232, the gas supplied by the corresponding gas source to the selected gas inlet port may be provided to the gas-providing nozzle 21. Subsequently, the wafer container 9 may be purged with the gas from the gas source corresponding to the selected gas inlet port.

More specifically, the controller 234 of the gas gate 23 may open the electric valve of the selected gas inlet port for connecting the selected gas inlet port to the gas-providing port 232, and close the electric valve of each gas inlet port except for the electric valve of the selected gas inlet port.

Figure 2C:
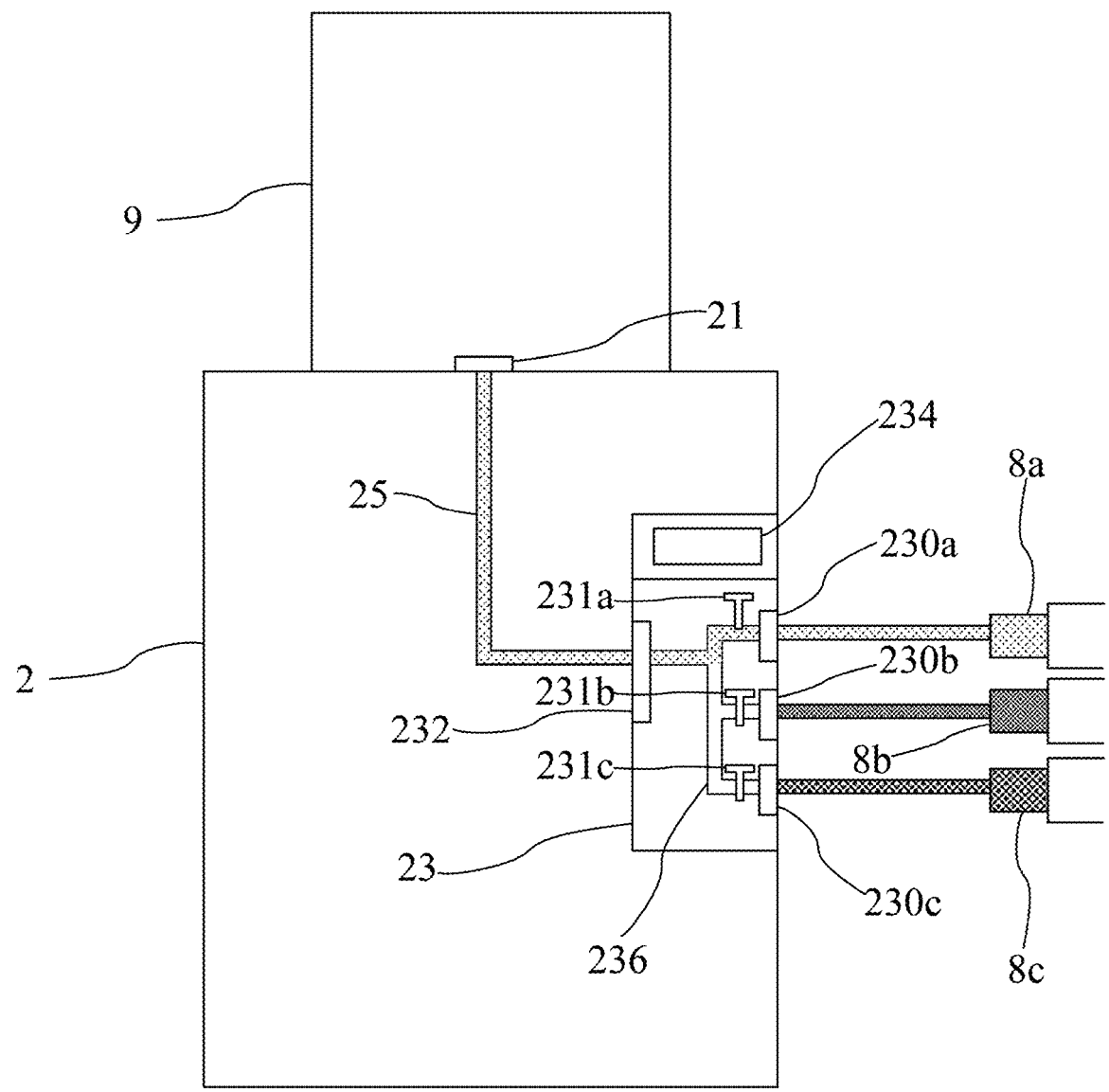
FIG. 2C is a schematic view of the load port device with a selected gas inlet port connected to a gas-providing port according to some embodiments of the present disclosure.

FIG. 2C is a schematic view of the load port device 2 with the selected gas inlet port connected to the gas-providing port 232 according to some embodiments of the present disclosure. For example, the controller 234 of the gas gate 23 selects the gas inlet port 230a. Next, for connecting the gas inlet port 230a to the gas-providing port 232, the controller 234: opens the electric valve 231a of the gas inlet port 230a; and closes the electric valve 231b of the gas inlet port 230b and the electric valve 231c of the gas inlet port 230c.

Therefore, when the gas inlet port 230a is connected to the gas-providing port 232, the gas supplied by the corresponding gas source 8a to the gas inlet port 230a may be provided to the gas-providing nozzle 21. Subsequently, the wafer container 9 may be purged with the gas from the gas source 8a.

Figure 2D:
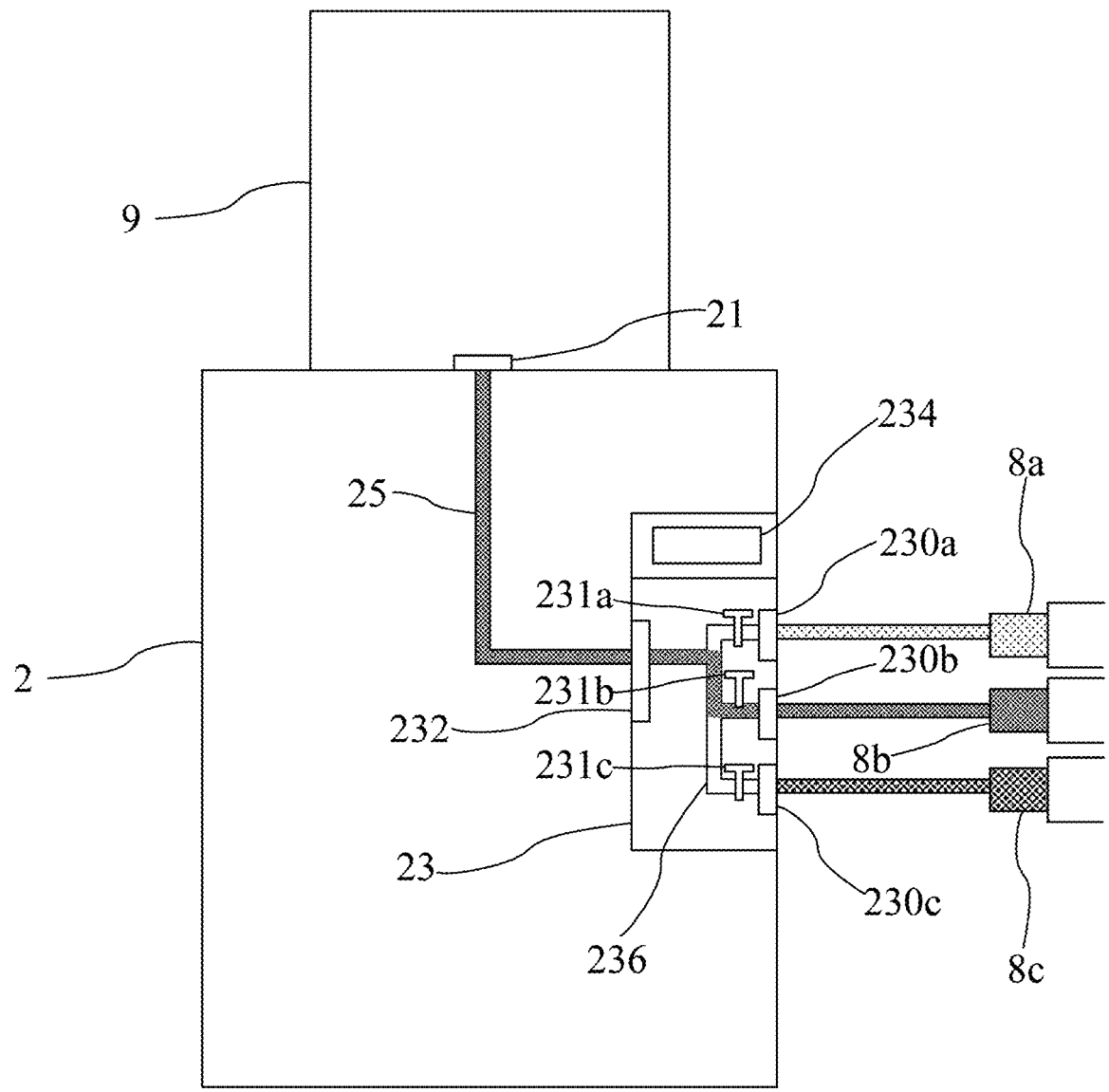
FIG. 2D is a schematic view of the load port device with a selected gas inlet port connected to the gas-providing port according to some embodiments of the present disclosure.

FIG. 2D is a schematic view of the load port device 2 with the selected gas inlet port connected to the gas-providing port 232 according to some embodiments of the present disclosure. For example, the controller 234 of the gas gate 23 selects the gas inlet port 230b. Next, for connecting the gas inlet port 230b to the gas-providing port 232, the controller 234: opens the electric valve 231b of the gas inlet port 230b; and closes the electric valve 231a of the gas inlet port 230a and the electric valve 231c of the gas inlet port 230c.

Therefore, when the gas inlet port 230b is connected to the gas-providing port 232, the gas supplied by the corresponding gas source 8b to the gas inlet port 230b may be provided to the gas-providing nozzle 21. Subsequently, the wafer container 9 may be purged with the gas from the gas source 8b.

Figure 2E:
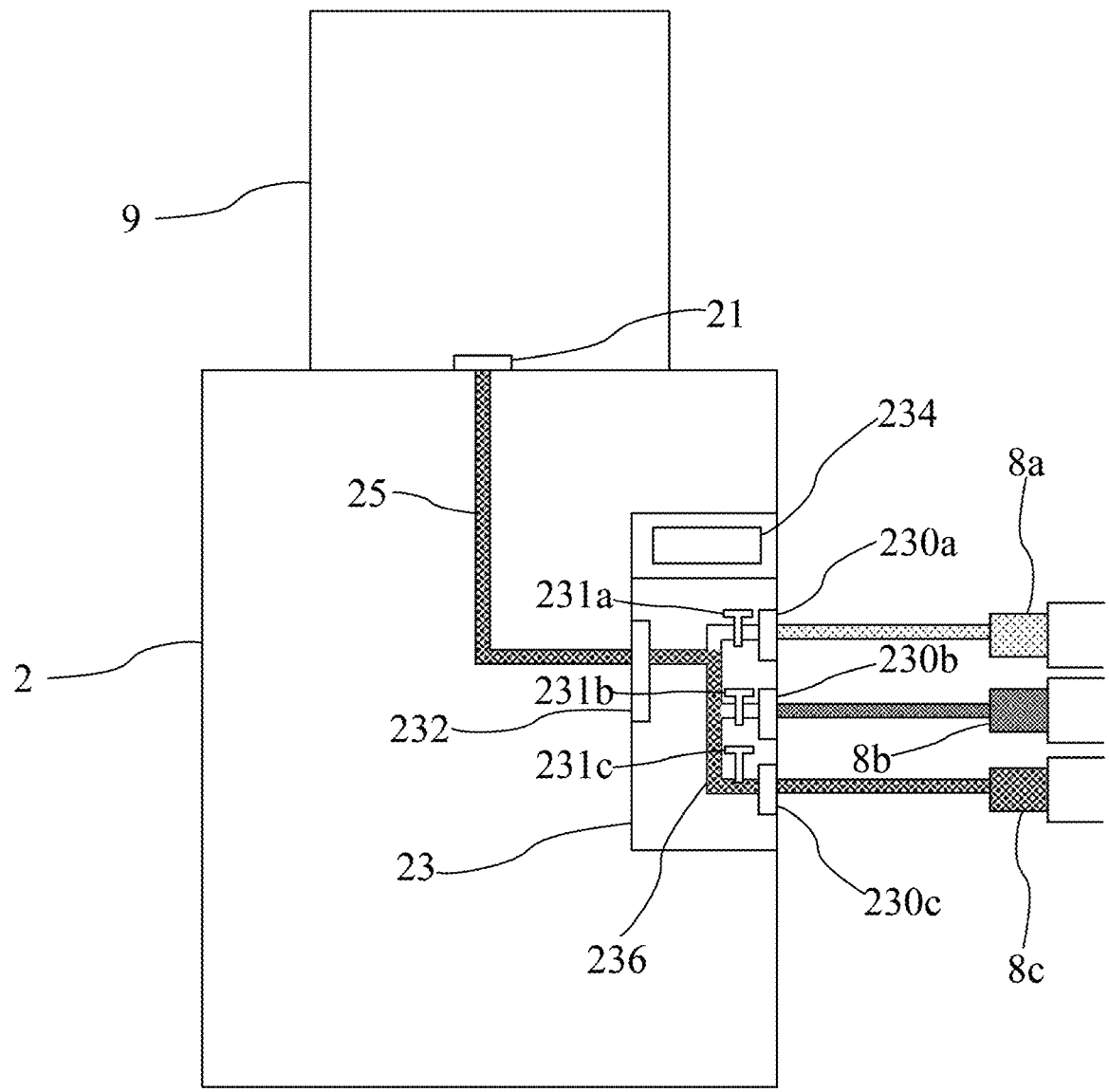
FIG. 2E is a schematic view of the load port device with a selected gas inlet port connected to the gas-providing port according to some embodiments of the present disclosure.

FIG. 2E is a schematic view of the load port device 2 with the selected gas inlet port connected to the gas-providing port 232 according to some embodiments of the present disclosure. For example, the controller 234 of the gas gate 23 selects the gas inlet port 230c. Next, for connecting the gas inlet port 230c to the gas-providing port 232, the controller 234: opens the electric valve 231c of the gas inlet port 230c; and closes the electric valve 231a of the gas inlet port 230a and the electric valve 231b of the gas inlet port 230b.

Therefore, when the gas inlet port 230c is connected to the gas-providing port 232, the gas supplied by the corresponding gas source 8c to the gas inlet port 230c may be provided to the gas-providing nozzle 21. Subsequently, the wafer container 9 may be purged with the gas from the gas source 8c.

Figure 2F:
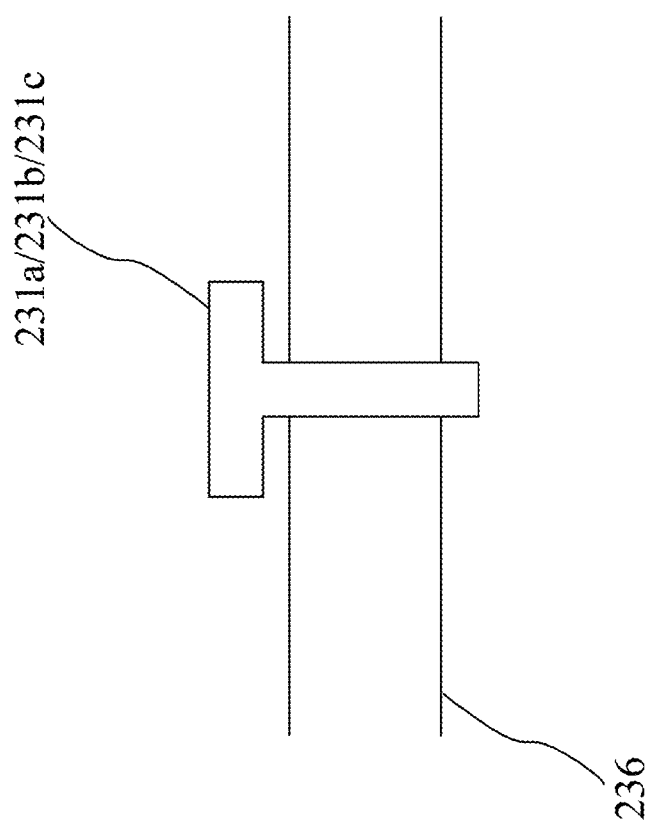

FIGS. 2F to 2G are schematic views of the electric valves 231a to 231c in operation according to some embodiments of the present disclosure. In particular, the controller 234 of the gas gate 23 may control the operations of the electric valves 231a to 231c.

Referring to FIG. 2F, the electric valve 231a, 231b or 231c may be closed by the controller 234 for blocking the gas from the corresponding gas source. Referring to FIG. 2G, the electric valve 231a, 231b or 231c may be opened by the controller 234 for allowing the gas from the corresponding gas source to flow.

In some embodiments, a gas control configuration (not shown) may be stored in a memory (not shown), which is electrically coupled to the controller 234, of the gas gate 23, and the controller 234 may control the electric valves 231a to 231c according to the gas control configuration.

In some embodiments, the gas control configuration may record flow rate parameters for each electric valve. Therefore, after selecting the gas inlet port, the controller 234 may determine the flow rate parameter corresponding to the electric valve of the selected gas inlet port. Next, the controller 234 may open the electric valve according to the flow rate parameter. More specifically, the range of the opening of the electric valve may correspond to the value of the flow rate parameter.

For example, the gas control configuration records flow rate parameters V1 to V3 for the electric valves 231a to 231c. When the controller 234 selects the gas inlet port 230a, the controller 234 determines the flow rate parameter V1 corresponding to the electric valve 231a of the selected gas inlet port 230a. Next, the controller 234 opens the electric valve 231a for allowing the gas from the gas source 8a to flow according to the flow rate parameter V1.

In some embodiments, the gas control configuration may record a duration for each electric valve. Therefore, after selecting the gas inlet port, the controller 234 may determine the duration corresponding to the electric valve of the selected gas inlet port. Next, the controller 234 may open the electric valve for the duration.

For example, the gas control configuration records durations T1 to T3 for the electric valves 231a to 231c. When the controller 234 selects the gas inlet port 230b, the controller 234 determines the duration T2 corresponding to the electric valve 231b of the selected gas inlet port 230b. Next, the controller 234 opens the electric valve 231b for the duration T2. After the duration T2 has elapsed, the controller 234 closes the electric valve 231b.

Figure 2H:
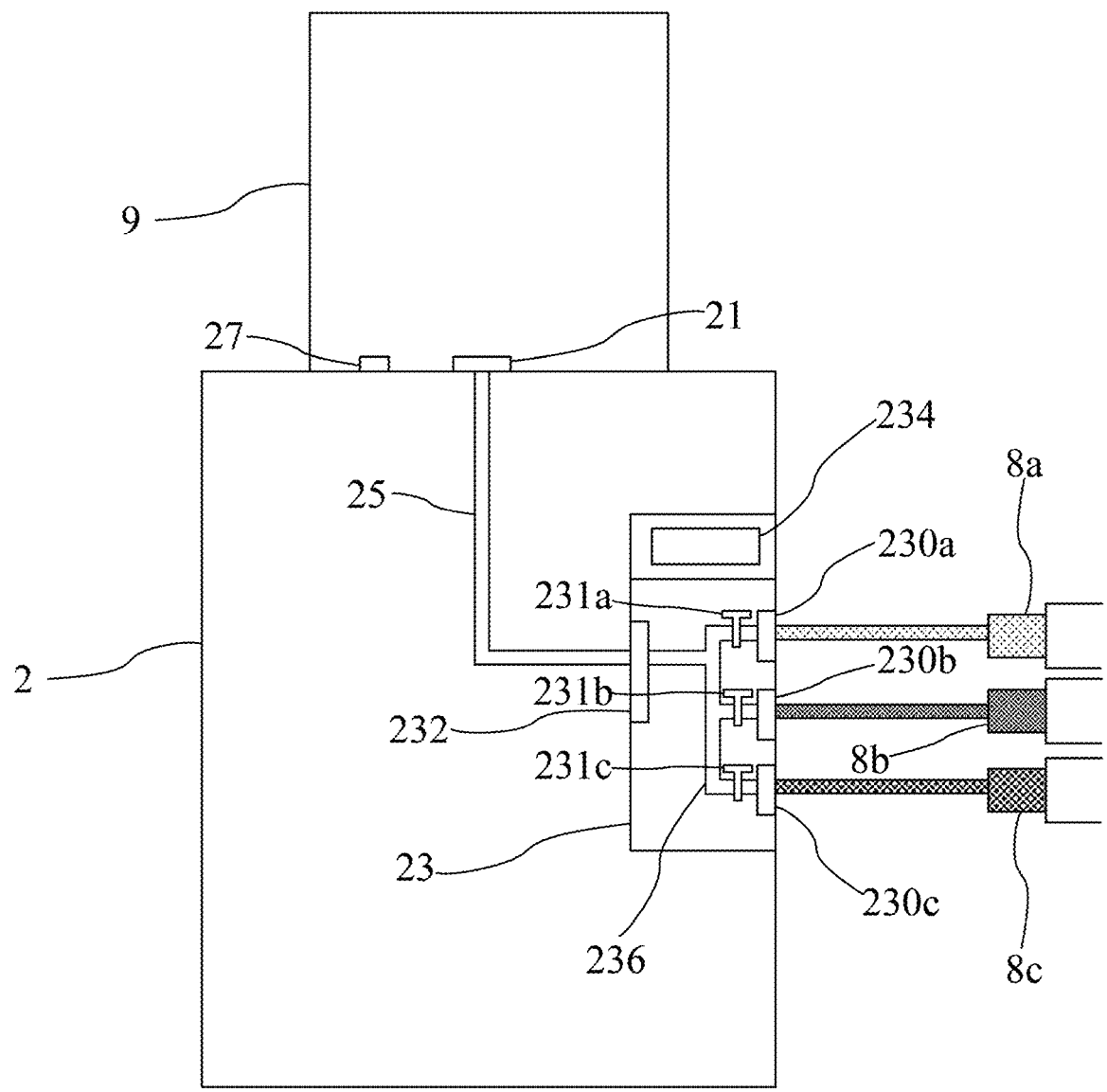
FIG. 2H is another schematic view of the load port device according to some embodiments of the present disclosure.
Figure 2I:
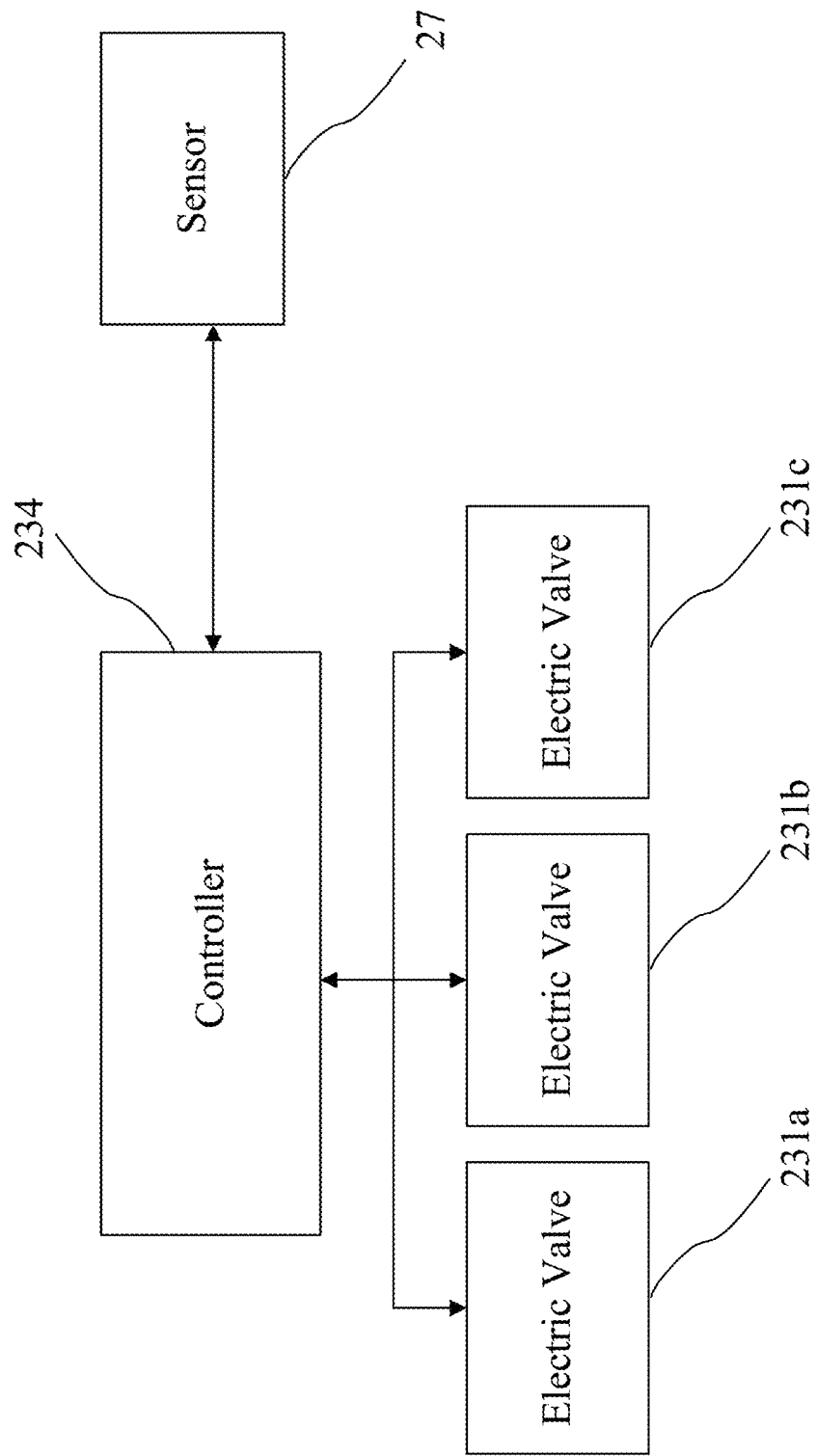
FIG. 2I is a block diagram of electric components according to some embodiments of the present disclosure.

FIG. 2H is another schematic view of the load port device 2 according to some embodiments of the present disclosure. In such embodiments, the load port device 2 may further include a sensor 27 for sensing a humidity or a concentration of oxygen in the wafer container 9. FIG. 2I is a block diagram of electric components according to some embodiments of the present disclosure. The sensor 27 may be electrically coupled to the controller 234 and transmit sensed data (i.e., the humidity or the concentration of oxygen in the wafer container 9) to the controller 234.

In some embodiments, the gas control configuration may record a threshold and a corresponding gas inlet port. The controller 234 may determine whether the humidity or the concentration of oxygen in the wafer container 9 is greater than the threshold. When the humidity or the concentration of oxygen is greater than the threshold, the controller 234 may select the corresponding gas inlet port and open the selected gas inlet port for purging the wafer container 9 to decrease the humidity or the concentration of oxygen in the wafer container 9.

For example, the gas control configuration records a threshold for humidity and a corresponding gas inlet port 230a. After the sensor 27 transmits the sensed humidity in the wafer container 9, the controller 234 determines whether the humidity in the wafer container 9 is greater than the threshold. When the humidity is greater than the threshold, the controller 234 selects the gas inlet port 230a according to the gas control configuration and opens the gas inlet port 230a for purging the wafer container 9 to decrease the humidity in the wafer container 9.

Figure 3:
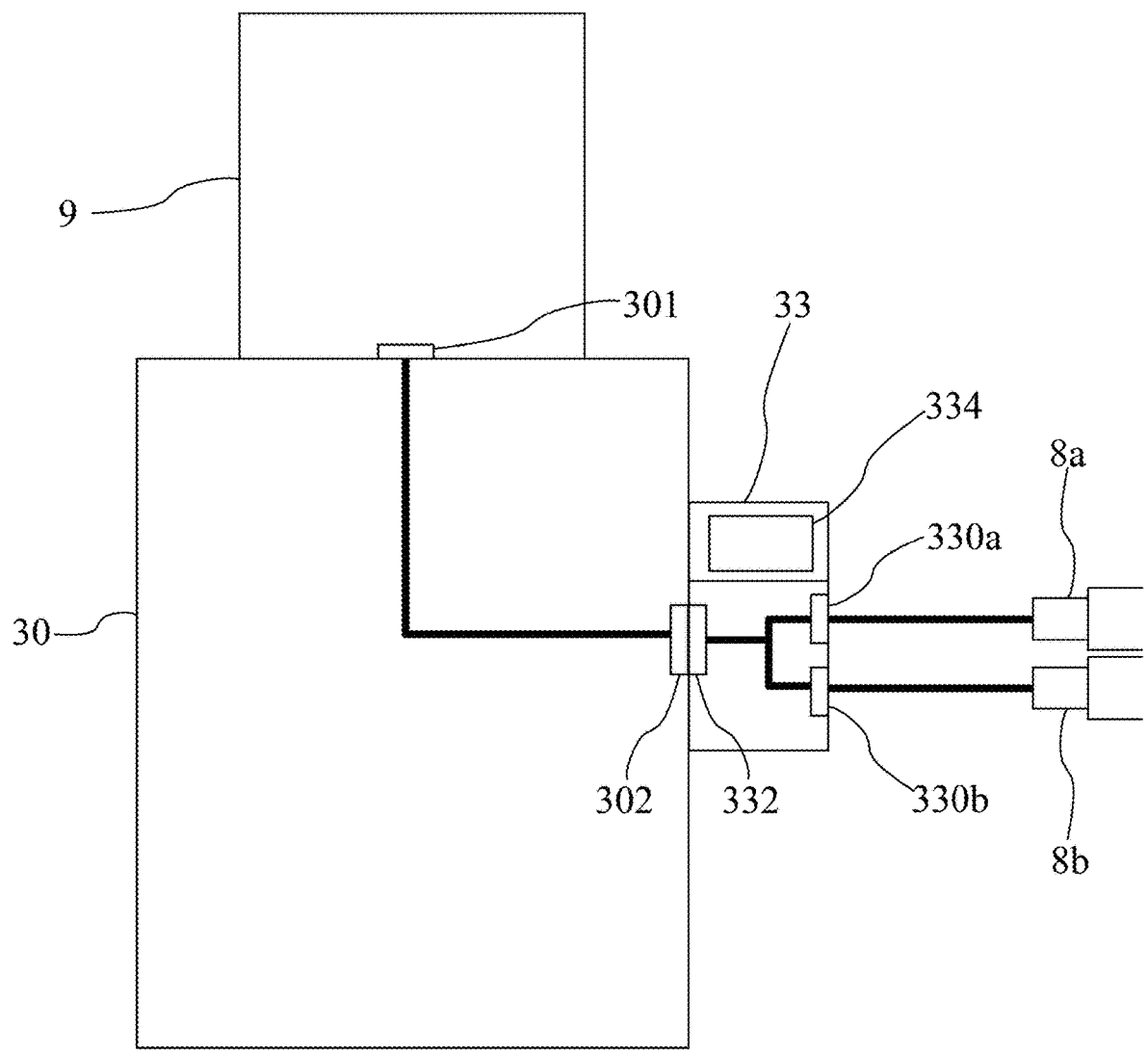
FIG. 3 is a schematic view of the load port device with a gas gate attached according to some embodiments of the present disclosure.

FIG. 3 is a schematic view of a load port device 30 with a gas gate 33 attached according to some embodiments of the present disclosure. The load port device 30 may be used for purging the wafer container 9 with gases. The load port device 30 may include a gas-providing nozzle 301 and a gas inlet port 302 connected to the gas-providing nozzle 301. When the load port 30 is loaded with the wafer container 9, the gas-providing nozzle 301 may be engaged with the inlet of the wafer container 9 for providing gas to the wafer container 9.

In some embodiments, the gas gate 33 may be assembled with the load port device 30 and used for connecting one gas source to the gas-providing nozzle 301. In particular, the gas gate 33 may include a plurality of gas inlet ports 330a and 330b, a gas-providing port 332 and a controller 334. The gas-providing port 332 of the gas gate 33 may connect to the gas inlet port 302 of the load port device 30 when the gas gate 33 is attached to the load port device 30. Therefore, the gas-providing port 332 of the gas gate 33 may connect to the gas-providing nozzle 301 of the load port device 30 via the gas inlet port 302.

Further, the gas inlet ports 330a and 330b of the gas gate 33 may connect to gas sources 8a and 8b, respectively. The gas inlet port 330a connected to the gas source 8a may receive gas from the gas source 8a. The gas inlet port 330b connected to the gas source 8b may receive gas from the gas source 8b.

In some embodiments, the controller 334 of the gas gate 33 may select one gas inlet port of the gas inlet ports 330a and 330b, and then connect the selected gas inlet port to the gas-providing port 332. When the selected gas inlet port is connected to the gas-providing port 332, the gas supplied by the corresponding gas source to the selected gas inlet port may be provided to the gas-providing nozzle 301. Subsequently, the wafer container 9 may be purged with the gas from the gas source corresponding to the selected gas inlet port.

For example, the controller 334 of the gas gate 33 selects the gas inlet port 330a, and connects the gas inlet port 330a to the gas-providing port 332. Therefore, when the gas inlet port 330a is connected to the gas-providing port 332, the gas supplied by the corresponding gas source 8a to the gas inlet port 330a may be provided to the gas-providing nozzle 301. Subsequently, the wafer container 9 may be purged with the gas from the gas source 8a.

Similarly, in another example, the controller 334 of the gas gate 33 selects the gas inlet port 330b, and connects the gas inlet port 330b to the gas-providing port 332. Therefore, when the gas inlet port 330b is connected to the gas-providing port 332, the gas supplied by the corresponding gas source 8b to the gas inlet port 330b may be provided to the gas-providing nozzle 31. Subsequently, the wafer container 9 may be purged with the gas from the gas source 8b.

Figure 4A:
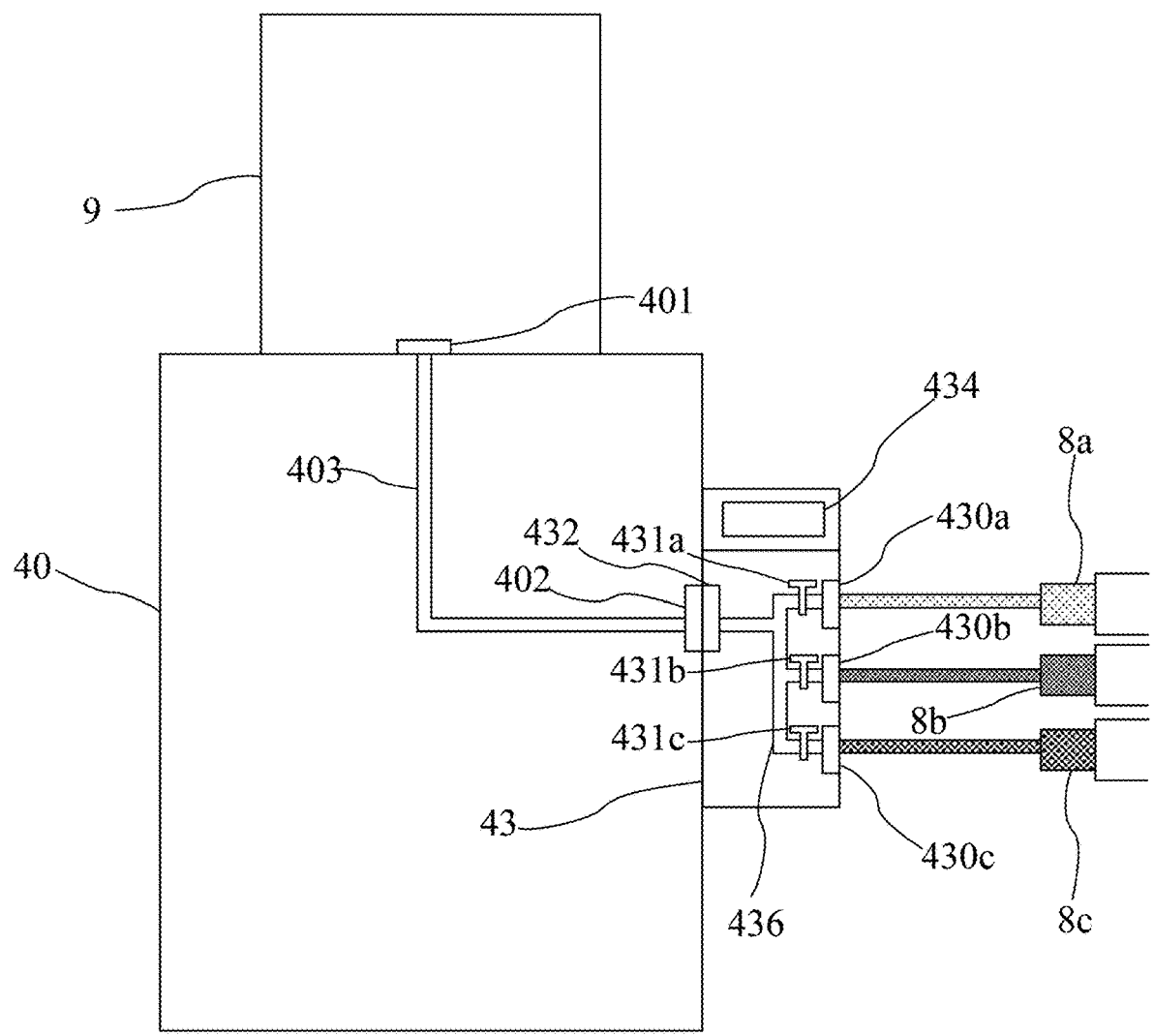
FIG. 4A is a schematic view of the load port device with a gas gate attached according to some embodiments of the present disclosure.

FIG. 4A is a schematic view of a load port device 40 with a gas gate 43 attached according to some embodiments of the present disclosure. The load port device 40 may be used for purging the wafer container 9 with gases. The load port device 40 may include a gas-providing nozzle 401, a gas inlet port 402 and a pipe 403. The gas-providing nozzle 401 may be connected to the gas inlet port 402 via the pipe 403. When the load port 40 is loaded with the wafer container 9, the gas-providing nozzle 401 may be engaged with the inlet of the wafer container 9 for providing gas to the wafer container 9.

In some embodiments, the gas gate 43 may be attached to the load port device 40 and used for connecting one gas source to the gas-providing nozzle 401. In particular, the gas gate 43 may include a plurality of gas inlet ports 430a to 430c, a gas-providing port 432, a controller 434 and a pipe 436. The gas inlet ports 430a to 430c may connect to the gas-providing port 432 via the pipe 436.

The gas-providing port 432 of the gas gate 43 may connect to the gas inlet port 402 of the load port device 40 when the gas gate 43 is attached to the load port device 40. Therefore, the gas-providing port 432 of the gas gate 43 may connect to the gas-providing nozzle 401 of the load port device 40 via the gas inlet port 402.

Further, the gas inlet ports 430a to 430b of the gas gate 43 may connect to gas sources 8a to 8c, respectively. The gas inlet port 430a connected to the gas source 8a may receive gas from the gas source 8a. The gas inlet port 430b connected to the gas source 8b may receive gas from the gas source 8b. The gas inlet port 430c connected to the gas source 8c may receive gas from the gas source 8c.

Figure 4B:
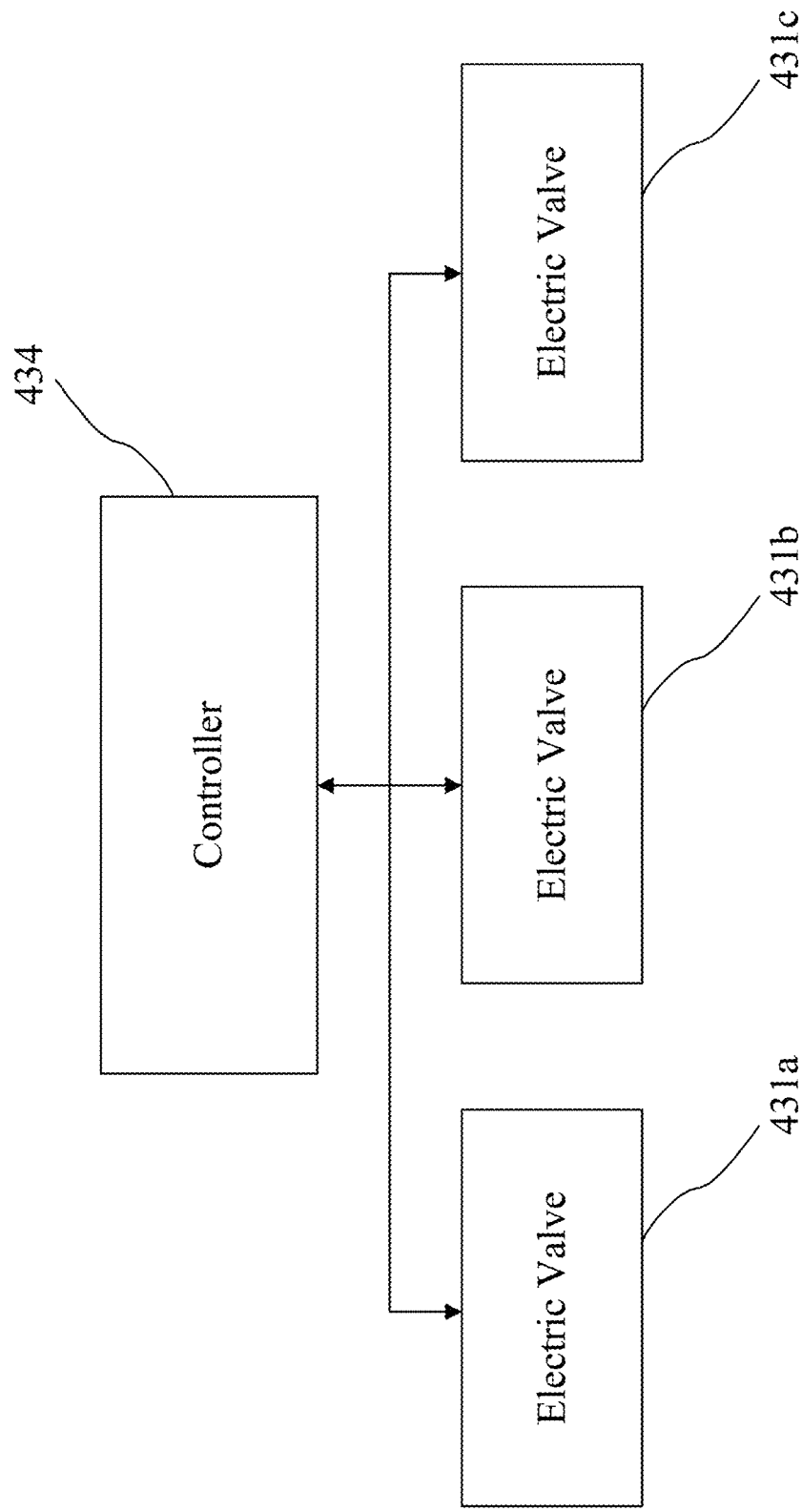
FIG. 4B is a block diagram of electric components according to some embodiments of the present disclosure.

In some embodiments, each gas inlet port may have an electric valve. In detail, the gas inlet port 430a may have an electric valve 431a, the gas inlet port 430b may have an electric valve 431b, and the gas inlet port 430c may have an electric valve 431c. FIG. 4B is a block diagram of electric components according to some embodiments of the present disclosure. The electric valves 431a to 431c may be electrically coupled to the controller 434 and controlled by the controller 434.

In some embodiments, the controller 434 of the gas gate 43 may select one gas inlet port of the gas inlet ports 430a to 430c, and then connect the selected gas inlet port to the gas-providing port 432. When the selected gas inlet port is connected to the gas-providing port 432, the gas supplied by the corresponding gas source to the selected gas inlet port may be provided to the gas-providing nozzle 401. Subsequently, the wafer container 9 may be purged with the gas from the gas source corresponding to the selected gas inlet port.

More specifically, the controller 434 of the gas gate 43 may open the electric valve of the selected gas inlet port for connecting the selected gas inlet port to the gas-providing port 432, and close the electric valve of each gas inlet port except for the electric valve of the selected gas inlet port.

Figure 4C:
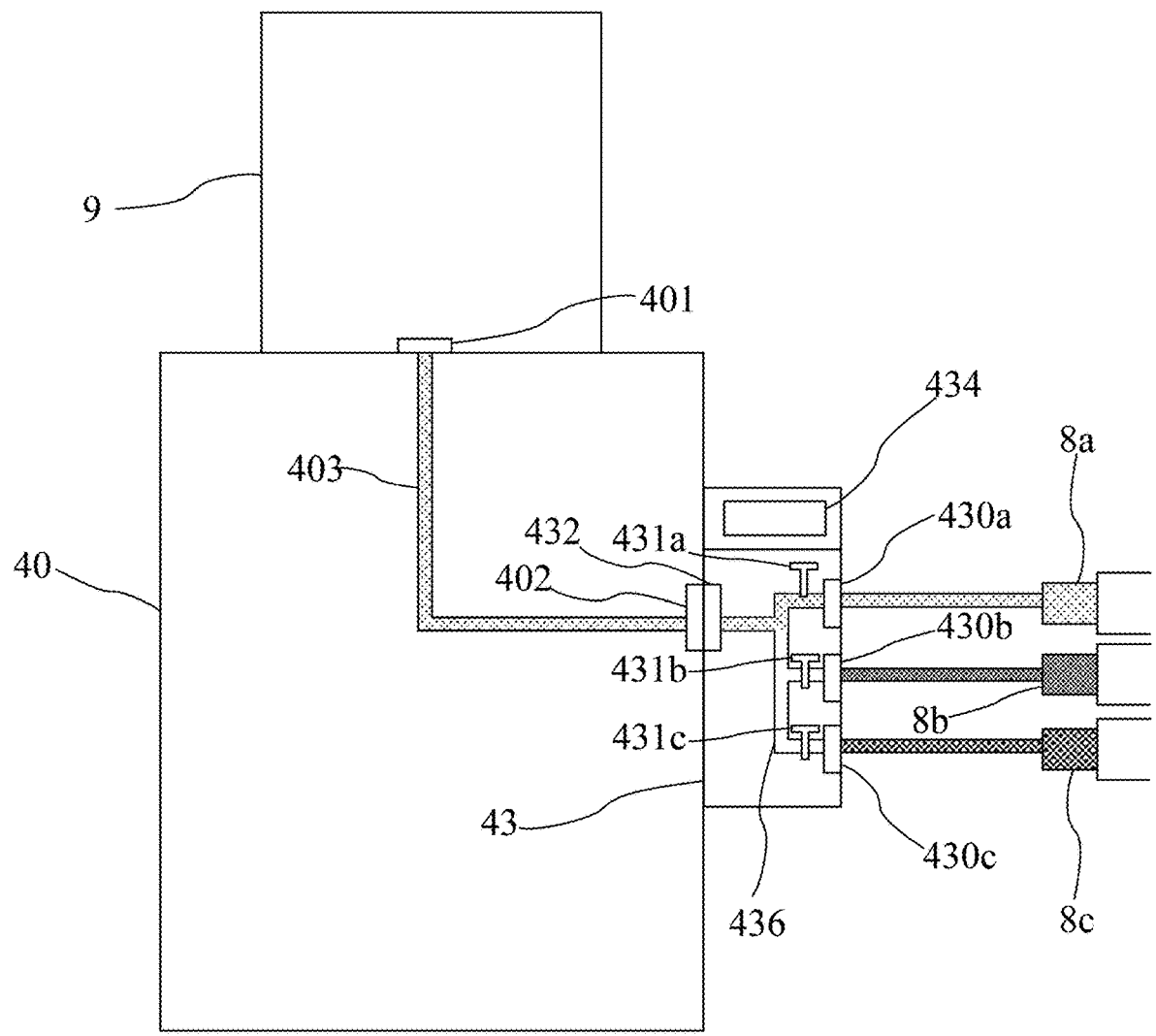
FIG. 4C is a schematic view of the load port device with a selected gas inlet port connected to the gas-providing port according to some embodiments of the present disclosure.

FIG. 4C is a schematic view of the load port device 40 with the selected gas inlet port 430a connected to the gas-providing port 432 according to some embodiments of the present disclosure. For example, the controller 434 of the gas gate 43 selects the gas inlet port 430a. Next, for connecting the gas inlet port 430a to the gas-providing port 432, the controller 434: opens the electric valve 431a of the gas inlet port 430a; and closes the electric valve 431b of the gas inlet port 430b and the electric valve 431c of the gas inlet port 430c.

Therefore, when the gas inlet port 430a is connected to the gas-providing port 432, the gas supplied by the corresponding gas source 8a to the gas inlet port 430a may be provided to the gas-providing nozzle 401. Subsequently, the wafer container 9 may be purged with the gas from the gas source 8a.

Figure 4D:
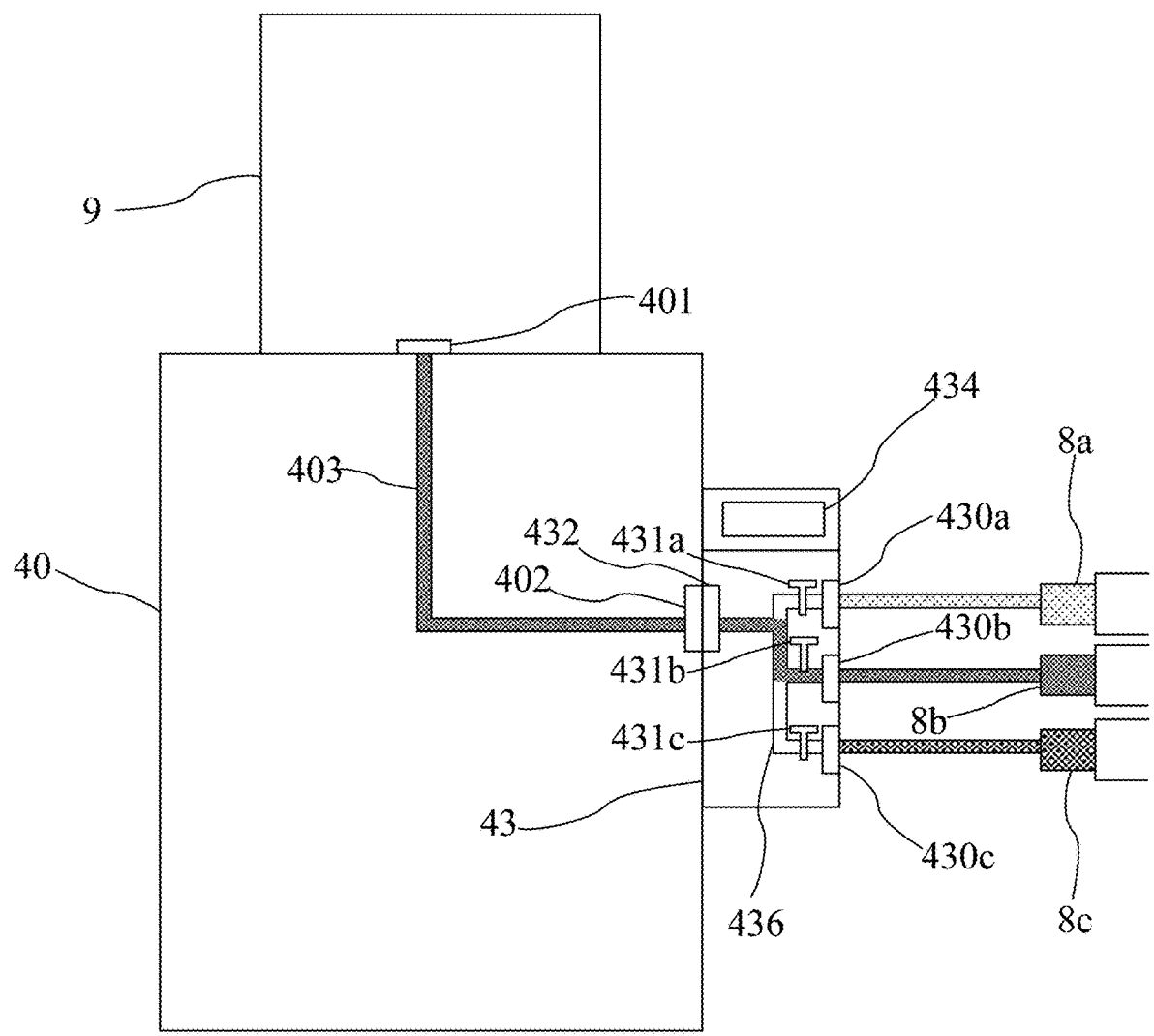
FIG. 4D is a schematic view of the load port device with a selected gas inlet port connected to the gas-providing port according to some embodiments of the present disclosure.

FIG. 4D is a schematic view of the load port device 40 with the selected gas inlet port connected to the gas-providing port 432 according to some embodiments of the present disclosure. For example, the controller 434 of the gas gate 43 selects the gas inlet port 430b. Next, for connecting the gas inlet port 430b to the gas-providing port 432, the controller 434: opens the electric valve 431b of the gas inlet port 430b; and closes the electric valve 431a of the gas inlet port 430a and the electric valve 431c of the gas inlet port 430c.

Therefore, when the gas inlet port 430b is connected to the gas-providing port 432, the gas supplied by the corresponding gas source 8b to the gas inlet port 430b may be provided to the gas-providing nozzle 401. Subsequently, the wafer container 9 may be is purged with the gas from the gas source 8b.

Figure 4E:
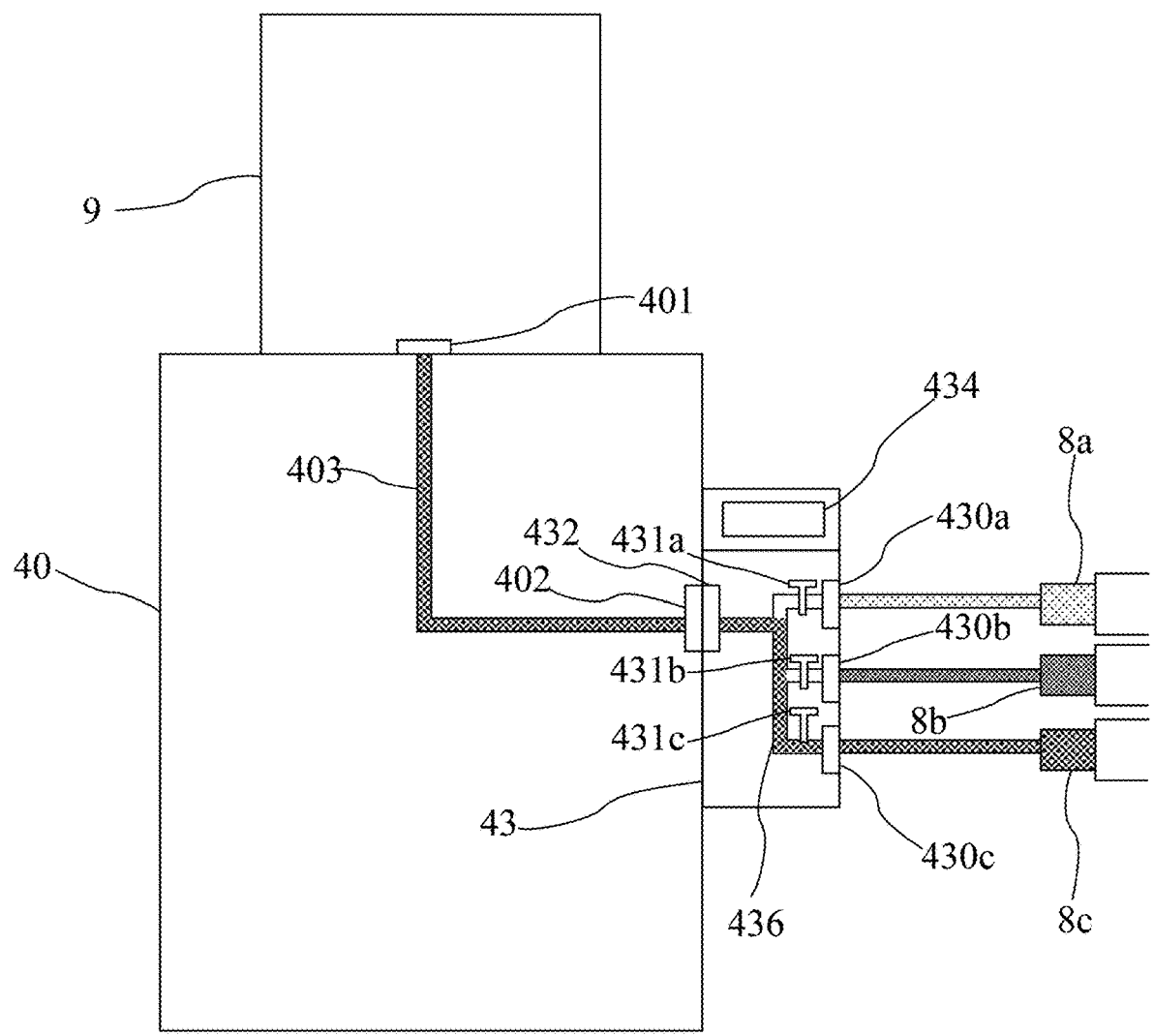
FIG. 4E is a schematic view of the load port device with a selected gas inlet port connected to the gas-providing port according to some embodiments of the present disclosure.

FIG. 4E is a schematic view of the load port device 40 with the selected gas inlet port connected to the gas-providing port 432 according to some embodiments of the present disclosure. For example, the controller 434 of the gas gate 43 selects the gas inlet port 430c. Next, for connecting the gas inlet port 430c to the gas-providing port 432, the controller 434: opens the electric valve 431c of the gas inlet port 430c; and closes the electric valve 431a of the gas inlet port 430a and the electric valve 431b of the gas inlet port 430b.

Therefore, when the gas inlet port 430c is connected to the gas-providing port 432, the gas supplied by the corresponding gas source 8c to the gas inlet port 430c may be provided to the gas-providing nozzle 401. Subsequently, the wafer container 9 may be purged with the gas from the gas source 8c.

In some embodiments, a gas control configuration (not shown) may be stored in a memory (not shown), which is electrically coupled to the controller 434 of the gas gate 43, and the controller 434 may control the electric valves 431a to 431c according to the gas control configuration.

In some embodiments, the gas control configuration may record flow rate parameters for each electric valve. Therefore, after selecting the gas inlet port, the controller 434 may determine the flow rate parameter corresponding to the electric valve of the selected gas inlet port. Next, the controller 434 may open the electric valve according to the flow rate parameter. More specifically, the range of the opening of the electric valve may correspond to the value of the flow rate parameter.

For example, the gas control configuration records flow rate parameters V1 to V3 for the electric valves 431a to 431c. When the controller 434 selects the gas inlet port 430a, the controller 434 determines the flow rate parameter V1 corresponding to the electric valve 431a of the selected gas inlet port 430a. Next, the controller 434 opens the electric valve 431a for allowing the gas to flow from the gas source 8a according to the flow rate parameter V1.

In some embodiments, the gas control configuration may record durations for each electric valve. Therefore, after selecting the gas inlet port, the controller 434 may determine the duration corresponding to the electric valve of the selected gas inlet port. Next, the controller 434 may open the electric valve for the duration.

For example, the gas control configuration records durations T1 to T3 for the electric valves 431a to 431c. When the controller 434 selects the gas inlet port 430b, the controller 434 determines the duration T2 corresponding to the electric valve 431b of the selected gas inlet port 430b. Next, the controller 434 opens the electric valve 431b for the duration T2. After the duration T2 has elapsed, the controller 434 closes the electric valve 431b.

Figure 4F:
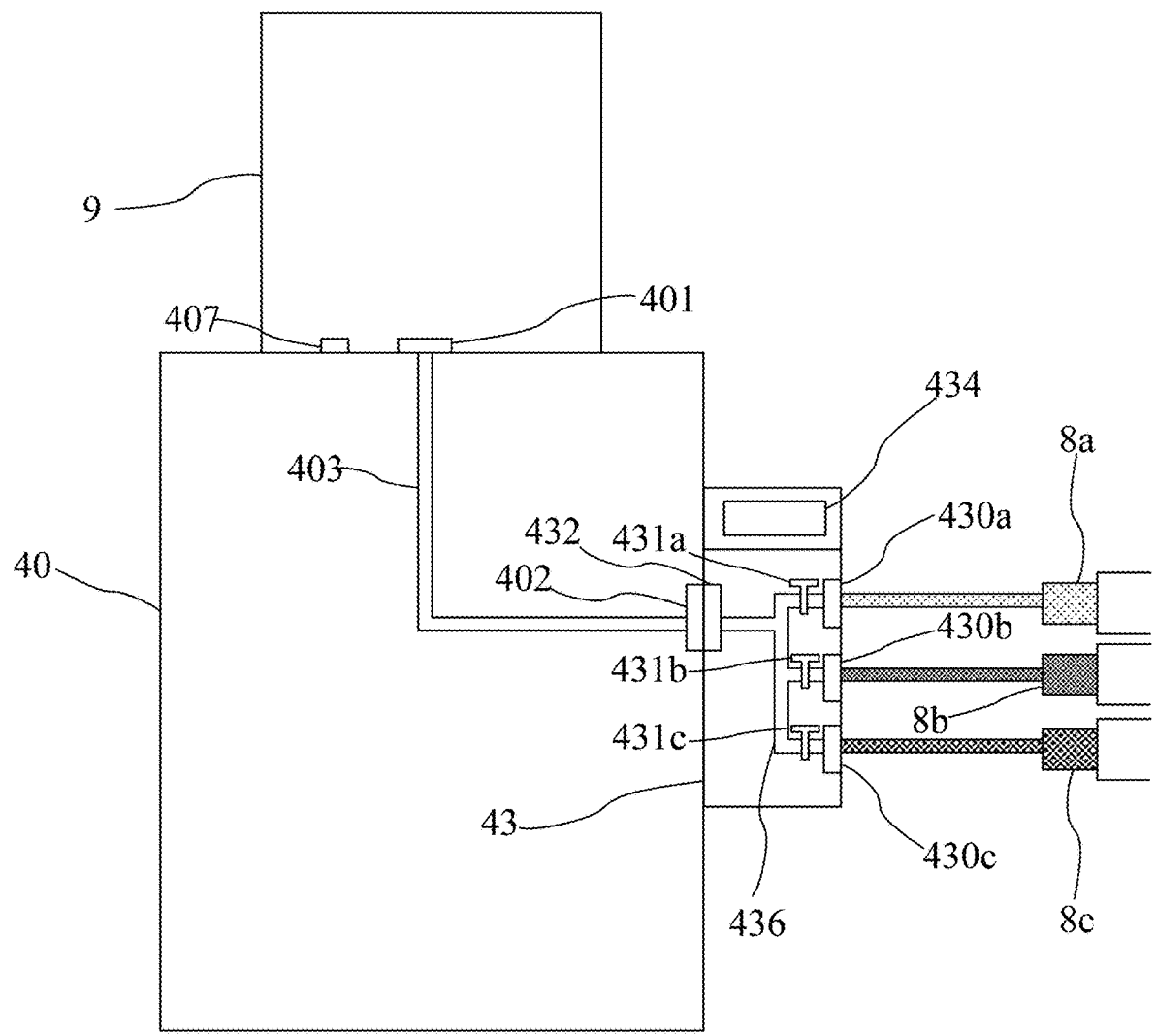
FIG. 4F is another schematic view of the load port device according to some embodiments of the present disclosure.
Figure 4G:
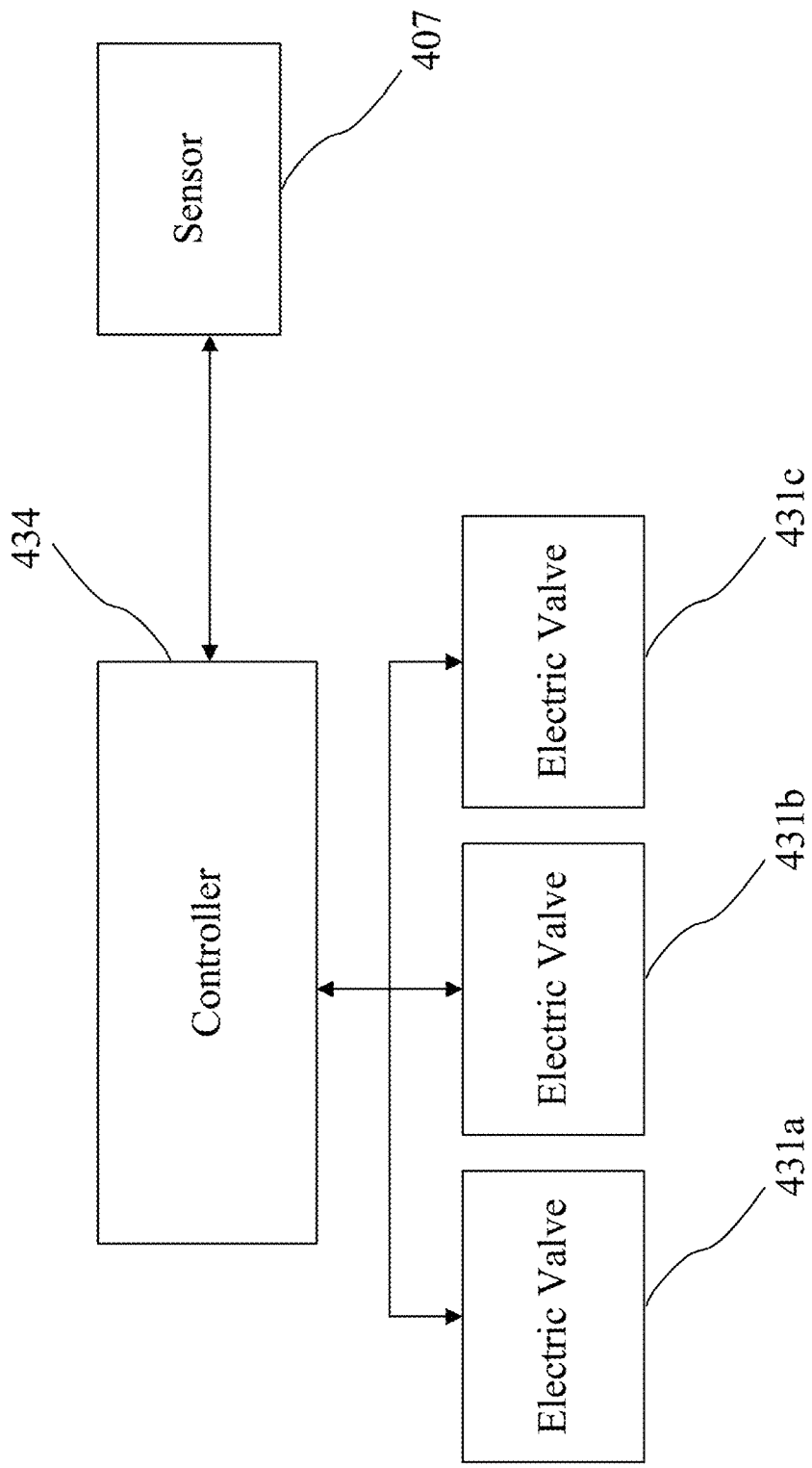
FIG. 4G is a block diagram of electric components according to some embodiments of the present disclosure.

FIG. 4F is another schematic view of the load port device 40 according to some embodiments of the present disclosure. In these embodiments, the load port device 40 may further include a sensor 407 for sensing a humidity or a concentration of oxygen in the wafer container 9. FIG. 4G is a block diagram of electric components according to some embodiments of the present disclosure. The sensor 407 may be electrically coupled to the controller 434 and transmit sensed data (i.e., the humidity or the concentration of oxygen in the is wafer container 9) to the controller 434.

In some embodiments, the gas control configuration may record a threshold and a corresponding gas inlet port. The controller 434 may determine whether the humidity or the concentration of oxygen in the wafer container 9 is greater than the threshold. When the humidity or the concentration of oxygen is greater than the threshold, the controller 434 may select the corresponding gas inlet port and open the selected gas inlet port for purging the wafer container 9 to decrease the humidity or the concentration of oxygen in the wafer container 9.

For example, the gas control configuration records a threshold for the concentration of oxygen and a corresponding gas inlet port 430c. After the sensor 407 transmits the sensed concentration of oxygen in the wafer container 9, the controller 434 determines whether the concentration of oxygen in the wafer container 9 is greater than the threshold. When the concentration of oxygen is greater than the threshold, the controller 434 selects the gas inlet port 430c according to the gas control configuration and opens the gas inlet port 430c for purging the wafer container 9 to decrease the concentration of oxygen in the wafer container 9.

Figure 5:
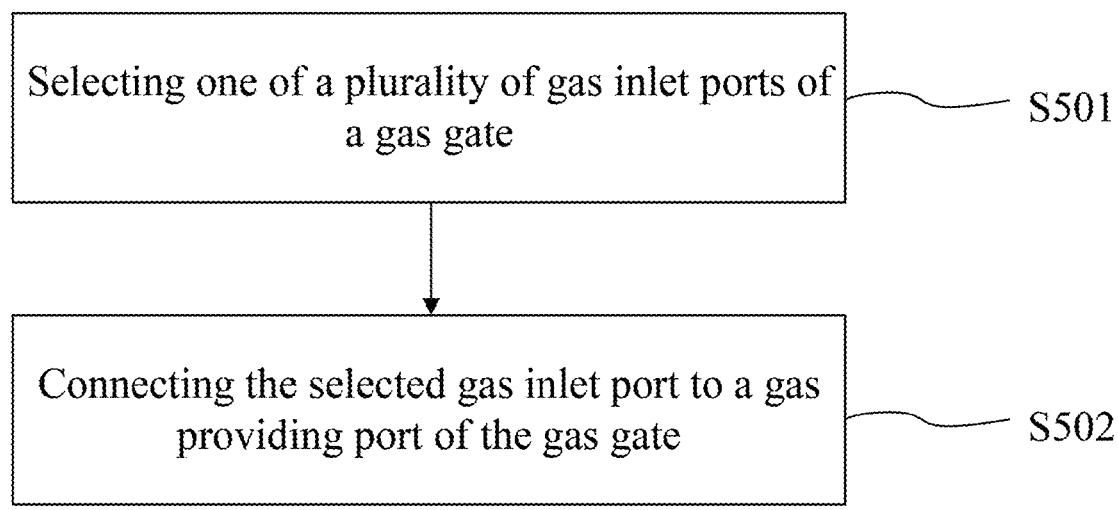
FIG. 5 is a flowchart diagram of a gas-providing method according to some embodiments of the present disclosure.

FIG. 5 is a flowchart diagram of a gas-providing method according to some embodiments of the present disclosure. The gas-providing method according to some embodiments is for use in a gas gate of a load port device (e.g., the gas gate of the load port device of the aforesaid embodiments). The load port device may be loaded with a wafer container, and a gas-providing nozzle of the load port device may be engaged with the inlet of the wafer container. Detailed steps of the gas-providing method are described below.

Operation S501 is executed to select, by a controller of the gas gate, one of a plurality of gas inlet ports of the gas gate. Each gas inlet port may connect to a gas source. Operation S502 is executed to connect, by the controller, the selected gas inlet port to a gas-providing port of the gas gate. The gas-providing port may connect to the gas-providing nozzle of the load port device. After the connection is established, gas may be supplied from the gas source to the gas-providing nozzle for purging the wafer container.

Figure 6:
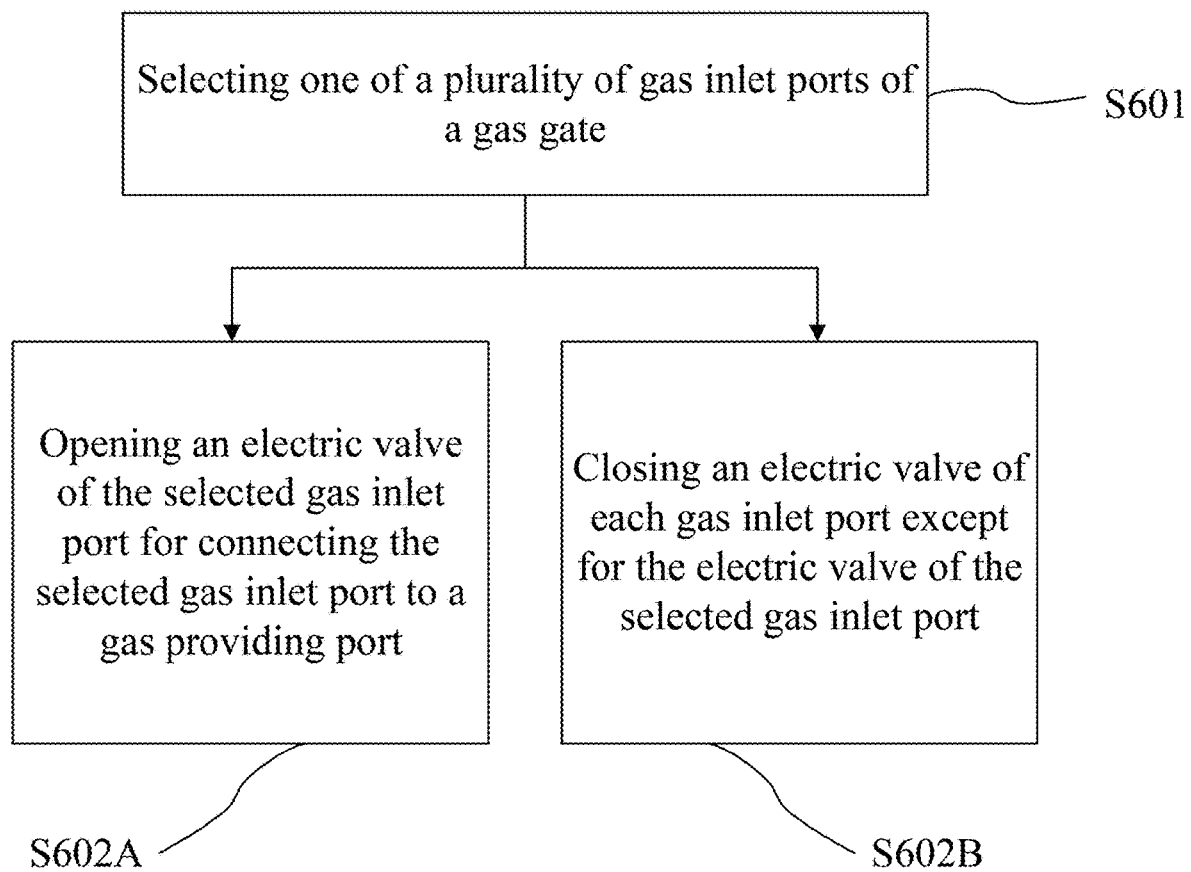
FIG. 6 is a flowchart diagram of a gas-providing method according to some embodiments of the present disclosure.

FIG. 6 is a flowchart diagram of a gas-providing method according to some embodiments of the present disclosure. The gas-providing method according to some embodiments is for use in a gas gate of a load port device (e.g., the gas gate of the load port device of the aforesaid embodiments). The load port device may be loaded with a wafer container, and a gas-providing nozzle of the load port device may be engaged with the inlet of the wafer container. Detailed steps of the gas-providing method are described below.

Operation S601 is executed to select, by a controller of the gas gate, one of a plurality of gas inlet ports of the gas gate. Each gas inlet port may connect to a gas source. Operation S602A is executed to open, by the controller, an electric valve of the selected gas inlet port for connecting the selected gas inlet port to a gas-providing port of the gas gate. Operation S602B is executed to close, by the controller, an electric valve of each gas inlet port except for the electric valve of the selected gas inlet port. After operations S602A and S602B, gas may be supplied by the gas source to the gas-providing nozzle for purging the wafer container.

In some embodiments, before the operation S602A, the is gas-providing method may further include a sub-operation of determining, by the controller, a flow rate parameter for the selected gas inlet port according to a gas control configuration. The electric valve of the selected gas inlet port may be opened according to the flow rate parameter.

In some embodiments, before the operation S601, the gas-providing method may further include a sub-operation of determining, by the controller, whether a humidity or a concentration of oxygen in the wafer container is greater than a threshold. The humidity or the concentration of oxygen may be sensed by a sensor of the load port device. The selected gas inlet port may be selected according to the gas control configuration when the humidity or the concentration of oxygen is greater than the threshold.

It shall be particularly appreciated that the gas supplied by the gas source in the above embodiments may include clean dry air (CDA), extreme clean dry air (XCDA), nitrogen or other gases capable of being used for purging the wafer container.

Further, the controller mentioned in the above embodiments may include a central processing unit (CPU), a micro controller unit (MCU), other hardware circuit elements capable of executing relevant instructions, or a combination of computing circuits that are well-known by those skilled in the art based on the above disclosures.

In addition, communication buses may be used for transferring data between the electric elements, such as the controller, the electric valves and the sensor, and may include an electrical bus interface, an optical bus interface or even a wireless bus interface. However, such description is not intended to limit the hardware implementation embodiments of the present disclosure.

One aspect of the present disclosure provides a load port device, including a gas-providing nozzle and a gas gate. The gas-providing nozzle is used for providing gas to a wafer container. The gas gate includes: a plurality of gas inlet ports, a gas-providing port and a controller. Each gas inlet port connects to a gas source. The gas-providing port connects to the gas-providing nozzle. The controller is configured to: select one of the plurality of gas inlet ports; and connect the selected gas inlet port to the gas-providing port.

Another aspect of the present disclosure provides a gas gate for use in a load port device. The gas gate includes: a plurality of gas inlet ports, a gas-providing port and a controller. Each gas inlet port connects to a gas source. The gas-providing port connects to a gas-providing nozzle of the load port device. The controller is configured to: select one of the plurality of gas inlet ports; and connect the selected gas inlet port to the gas-providing port.

Another aspect of the present disclosure provides a gas-providing method for a gas gate of a load port device. The gas-providing method includes: selecting, by a controller, one of a plurality of gas inlet ports of the gas gate, wherein each gas inlet port connects to a gas source; and connecting the selected gas inlet port to a gas-providing port of the gas gate, wherein the gas-providing port connects to a gas-providing nozzle of the load port device.

Although the present disclosure and its advantages have been described in detail, it should be understood that various changes, substitutions and alterations can be made herein without departing from the spirit and scope of the disclosure as defined by the appended is claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A load port device, comprising:
   a gas-providing nozzle for providing gas to a wafer container;
   a gas gate, comprising:
      a plurality of gas inlet ports, wherein each gas inlet port connects to a gas source;
      a gas-providing port, connecting with the gas providing nozzle; and
      a controller, being configured to:
         select one of the plurality of gas inlet ports; and
         connect the selected gas inlet port to the gas-providing port; and
   a sensor connected with an interior space of the wafer container to sense a humidity or a concentration of oxygen in the wafer container, and the sensor electrically coupled to the controller;
   wherein the controller is further configured to:
      determine whether the humidity or the concentration of oxygen in the wafer container is greater than a threshold;
      determine a flow rate parameter for the selected gas inlet port;
   wherein the controller selects one of the plurality of gas inlet ports according to a gas control configuration recording the threshold, a corresponding gas inlet port and the flow rate parameter of electric valves of the plurality of gas inlet ports; wherein when the humidity or the concentration of oxygen is greater than the threshold, the controller selects the corresponding gas inlet port and open the selected corresponding gas inlet port according to the flow rate parameter for purging the wafer container; wherein an opening range of the electric valve of the selected gas inlet port correspond to a value of the flow rate parameter.

2. The load port device of claim 1, further comprising a pipe for connecting the gas-providing port to the gas-providing nozzle.

3. The load port device of claim 1, wherein the gas gate further comprises a pipe for connecting the plurality of gas inlet ports to the gas-providing port.

4. The load port device of claim 3, wherein the electric valves of the plurality of gas inlet ports are electrically coupled to the controller, and the controller is further configured to:
   open the electric valve of the selected gas inlet port for connecting the selected gas inlet port to the gas-providing port.

5. The load port device of claim 4, wherein the controller is further configured to:
   close the electric valve of each gas inlet port except for the electric valve of the selected gas inlet port.

6. The load port device of claim 4, wherein the electric valve of the selected gas inlet port is opened for a duration according to the gas control configuration, wherein the gas control configuration records the duration for each electric valve.

7. A gas gate for use in a load port device loaded with a wafer container, comprising:
   a plurality of gas inlet ports, wherein each gas inlet port connects to a gas source;
   a gas-providing port, connecting to a gas-providing nozzle of the load port device; and
   a controller, being configured to:
      select one of the plurality of gas inlet ports;
      connect the selected gas inlet port to the gas providing port; and
      determine whether a humidity or a concentration of oxygen in the wafer container is greater than a threshold, wherein the humidity or the concentration of oxygen is sensed by a sensor of the load port device, the sensor connected with an interior space of the wafer container;
      determine a flow rate parameter for the selected gas inlet port;
      wherein the controller selects one of the plurality of gas inlet ports according to a gas control configuration recording the threshold, a corresponding gas inlet port and the flow rate parameter of electric valves of the plurality of gas inlet ports; wherein when the humidity or the concentration of oxygen is greater than the threshold, the controller selects the corresponding gas inlet port and open the selected corresponding gas inlet port according to the flow rate parameter for purging the wafer container; wherein an opening range of the electric valve of the selected gas inlet port correspond to a value of the flow rate parameter.

8. The gas gate of claim 7, further comprising a pipe for connecting the plurality of gas inlet ports to the gas-providing port.

9. The gas gate of claim 8, wherein the electric valves of the plurality of gas inlet ports are electrically coupled to the controller, and the controller is further configured to:
   open the electric valve of the selected gas inlet port for connecting the selected gas inlet port to the gas-providing port.

10. The gas gate of claim 9, wherein the controller is further configured to:
    close the electric valve of each gas inlet port except for the electric valve of the selected gas inlet port.

11. The gas gate of claim 9, wherein the electric valve of the selected gas inlet port is opened for a duration according to the gas control configuration, wherein the gas control configuration records the duration for each electric valve.

12. A gas-providing method for a gas gate of a load port device loaded with a wafer container, comprising:
    selecting, by a controller of the gas gate, one of a plurality of gas inlet ports of the gas gate, wherein each gas inlet port connects to a gas source;
    connecting, by the controller, the selected gas inlet port to a gas providing port of the gas gate, wherein the gas-providing port connects to a gas-providing nozzle of the load port device; and
    determining, by the controller, whether a humidity or a concentration of oxygen in a wafer container is greater than a threshold, wherein the humidity or the concentration of oxygen is sensed by a sensor of the load port device, the sensor connected with an interior space of the wafer container;
    determining, by the controller, a flow rate parameter for the selected gas inlet port;
    wherein the controller selects one of the plurality of gas inlet ports according to a gas control configuration recording the threshold, a corresponding gas inlet port and the flow rate parameter of electric valves of the plurality of gas inlet ports; wherein when the humidity or the concentration of oxygen is greater than the threshold, the controller selects the corresponding gas inlet port and open the selected corresponding gas inlet port according to the flow rate parameter for purging the wafer container; wherein an opening range of the electric valve of the selected gas inlet port correspond to a value of the flow rate parameter.

13. The gas-providing method of claim 12, further comprising:
opening, by the controller, an electric valve of the selected gas inlet port for connecting the selected gas inlet port to the gas-providing port.

14. The gas-providing method of claim 13, further comprising:
closing, by the controller, an electric valve of each gas inlet port except for the electric valve of the selected gas inlet port.

* * * * *